US012628699B2

(12) United States Patent
Stella et al.

(10) Patent No.: US 12,628,699 B2
(45) Date of Patent: May 12, 2026

(54) PACKAGED ELECTRONIC DEVICE COMPRISING A PLURALITY OF POWER TRANSISTORS

(71) Applicant: STMICROELECTRONICS S.r.l., Agrate Brianza (IT)

(72) Inventors: Cristiano Gianluca Stella, San Gregorio di Catania (IT); Agatino Minotti, Mascalucia (IT); Francesco Salamone, Acireale (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 416 days.

(21) Appl. No.: 18/188,918

(22) Filed: Mar. 23, 2023

(65) Prior Publication Data
US 2023/0317685 A1      Oct. 5, 2023

(30) Foreign Application Priority Data

Apr. 1, 2022   (IT) ........................ 102022000006563

(51) Int. Cl.
*H01L 25/07*        (2006.01)
*H01L 23/31*        (2006.01)
(Continued)

(52) U.S. Cl.
CPC ........ *H01L 25/072* (2013.01); *H01L 23/3107* (2013.01); *H01L 23/3735* (2013.01); *H01L 23/473* (2013.01); *H01L 23/5383* (2013.01)

(58) Field of Classification Search
CPC . H01L 21/4825; H01L 21/56; H01L 23/3107; H01L 23/3114; H01L 23/3171;
(Continued)

(56) References Cited

U.S. PATENT DOCUMENTS 6,236,098 B1   5/2001   Efland et al.
6,697,257 B1   2/2004   Wolf et al.
(Continued)

FOREIGN PATENT DOCUMENTS

CN          1542957 A     11/2004
CN        106486431 A      3/2017
(Continued)

OTHER PUBLICATIONS

"ST Offer for Power Modules," Web Page <https://www.st.com/en/power-modules/stpower-acepack-modules.html#resource>, availability date Mar. 21, 2018, retrieval date Mar. 20, 2020, 22 pages.
(Continued)

*Primary Examiner* — Amir A Jalali
(74) *Attorney, Agent, or Firm* — Seed IP Law Group LLP

(57)                ABSTRACT
Electronic device comprising at least a first and a second branch, each branch including a first and a second transistor arranged in series to each other and formed in respective dice of semiconductor material. The dice are sandwiched between a first substrate element and a second substrate element. The first and the second substrate elements are formed each by a multilayer including a first conductive layer, a second conductive layer and an insulating layer extending between the first and the second conductive layers. The first conductive layers of the first and the second substrate elements face towards the outside of the electronic device and define a first and a second main face of the electronic device. The second conductive layer of the first and the second substrate elements is shaped so as to form contact regions facing and in selective electrical contact with the plurality of dice.

20 Claims, 14 Drawing Sheets

(51) Int. Cl.
| | |
|---|---|
| *H01L 23/373* | (2006.01) |
| *H01L 23/473* | (2006.01) |
| *H01L 23/538* | (2006.01) |

(58) Field of Classification Search
CPC . H01L 23/34; H01L 23/3672; H01L 23/3677; H01L 23/3736; H01L 23/473; H01L 23/49527; H01L 23/49537; H01L 23/49562; H01L 23/49568; H01L 23/49575; H01L 23/49822; H01L 23/49861; H01L 23/4389; H01L 23/844; H01L 24/19; H01L 24/20; H01L 24/25; H01L 24/32; H01L 2224/244; H01L 2224/2501; H05K 7/2039; H05K 7/20418; H05K 7/209; H05K 2201/066; H05K 2201/10166
See application file for complete search history.

(56) References Cited

U.S. PATENT DOCUMENTS

| | | | |
|---|---|---|---|
| 9,986,361 | B2 | 5/2018 | Chon et al. |
| 9,986,631 | B2 | 5/2018 | Rizza et al. |
| 10,002,821 | B1 * | 6/2018 | Hoegerl ................ H01L 23/051 |
| 10,720,373 | B2 | 7/2020 | Salamone et al. |
| 11,373,924 | B2 * | 6/2022 | Park ...................... H01L 25/072 |
| 11,862,531 | B2 * | 1/2024 | Xu ....................... H01L 23/4334 |
| 2005/0047186 | A1 | 3/2005 | Gerbsch et al. |
| 2006/0151874 | A1 | 7/2006 | Milich et al. |
| 2006/0163648 | A1 | 7/2006 | Hauenstein et al. |
| 2006/0180916 | A1 | 8/2006 | Wyland |
| 2007/0138651 | A1 | 6/2007 | Hauenstein |
| 2007/0267739 | A1 | 11/2007 | Kajiwara et al. |
| 2007/0290311 | A1 | 12/2007 | Hauenstein |
| 2008/0054439 | A1 | 3/2008 | Malhan et al. |
| 2009/0102067 | A1 | 4/2009 | Wyland |
| 2009/0166850 | A1 | 7/2009 | Jeon et al. |
| 2010/0133670 | A1 | 6/2010 | Liu et al. |
| 2010/0164078 | A1 | 7/2010 | Madrid et al. |
| 2011/0037166 | A1 * | 2/2011 | Ikeda ...................... H01L 24/73 |
| | | | 257/E23.101 |
| 2011/0132431 | A1 | 6/2011 | Linderman et al. |
| 2012/0104580 | A1 | 5/2012 | Feng et al. |
| 2012/0250253 | A1 * | 10/2012 | Chou ................... H01L 25/071 |
| | | | 361/689 |
| 2013/0020694 | A1 | 1/2013 | Liang et al. |
| 2013/0307156 | A1 | 11/2013 | Bayerer |
| 2014/0151872 | A1 * | 6/2014 | Ogawa ................. H01L 25/074 |
| | | | 257/719 |
| 2014/0159212 | A1 | 6/2014 | Hung et al. |
| 2014/0246783 | A1 | 9/2014 | Nishizawa et al. |
| 2015/0255380 | A1 | 9/2015 | Chen |

| | | | |
|---|---|---|---|
| 2015/0303881 | A1 | 10/2015 | Blednov et al. |
| 2015/0311144 | A1 | 10/2015 | Williams et al. |
| 2015/0380384 | A1 | 12/2015 | Williams et al. |
| 2016/0005675 | A1 | 1/2016 | Tong |
| 2016/0064308 | A1 | 3/2016 | Yamada |
| 2016/0204046 | A1 | 7/2016 | Iwashige |
| 2017/0064808 | A1 * | 3/2017 | Rizza ...................... H01L 25/18 |
| 2017/0236782 | A1 | 8/2017 | Nonaka |
| 2017/0365583 | A1 * | 12/2017 | Im .......................... H01L 21/565 |
| 2018/0040593 | A1 | 2/2018 | Zhou et al. |
| 2018/0138136 | A1 | 5/2018 | Tonegawa |
| 2018/0233424 | A1 | 8/2018 | Sung et al. |
| 2019/0088594 | A1 | 3/2019 | Ikeda et al. |
| 2019/0103340 | A1 * | 4/2019 | Tsuchimochi ...... H01L 23/4334 |
| 2019/0109225 | A1 | 4/2019 | Russo et al. |
| 2019/0311976 | A1 | 10/2019 | Salamone et al. |
| 2020/0163253 | A1 * | 5/2020 | Lunsman ................... G06F 1/20 |
| 2021/0037674 | A1 | 2/2021 | Stella et al. |
| 2021/0125914 | A1 | 4/2021 | Harazono |
| 2021/0151417 | A1 * | 5/2021 | Strogies ............ H01L 23/49838 |
| 2022/0115290 | A1 * | 4/2022 | Bagung ................ H05K 1/0209 |
| 2022/0157767 | A1 | 5/2022 | Tanaka |
| 2022/0199578 | A1 * | 6/2022 | Tsuchimochi .......... H01L 24/32 |
| 2022/0238413 | A1 * | 7/2022 | Grassmann ......... H01L 23/3735 |
| 2022/0415858 | A1 * | 12/2022 | Chew ...................... H01L 24/97 |
| 2023/0282567 | A1 * | 9/2023 | Liu ..................... H01L 23/3735 |
| | | | 257/700 |
| 2023/0307376 | A1 * | 9/2023 | Liu .......................... H01L 24/08 |
| 2023/0412106 | A1 * | 12/2023 | You ..................... H01L 23/5385 |
| 2024/0079372 | A1 * | 3/2024 | Omae .................... H01L 24/49 |
| 2024/0107675 | A1 * | 3/2024 | Buehler ............. H02M 1/0048 |
| 2024/0153862 | A1 * | 5/2024 | Lu .......................... H01L 24/83 |
| 2024/0206133 | A1 | 6/2024 | Stella et al. |
| 2025/0227895 | A1 | 7/2025 | Stella et al. |

FOREIGN PATENT DOCUMENTS

| | | | |
|---|---|---|---|
| CN | 109637984 | A | 4/2019 |
| CN | 212907713 | U | 4/2021 |
| DE | 102006040838 | A1 | 3/2008 |
| DE | 102013210146 | A1 | 12/2014 |
| DE | 112019007349 | T5 | 2/2022 |
| EP | 3370332 | A1 | 9/2018 |
| EP | 3780100 | A1 | 2/2021 |
| FR | 2 786 657 | A1 | 6/2000 |
| JP | 2014067897 | A | 4/2014 |
| JP | 2016167503 | A | 9/2016 |

OTHER PUBLICATIONS

Xiao-Dong et al., "Packaging Structure and Technology of Power Electronic Module," Electronics & Packaging, vol. 9, No. 11, China Academic Journal Electronic Publishing House, 7 pages.

* cited by examiner

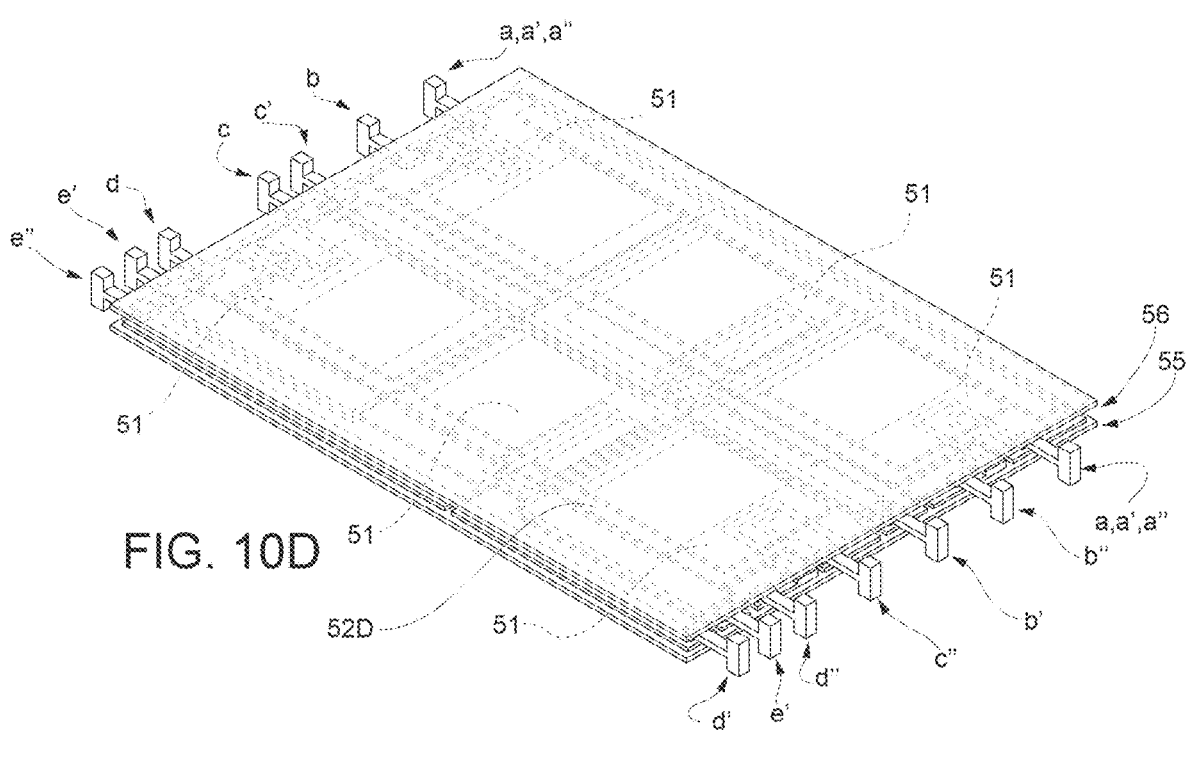
FIG. 10D
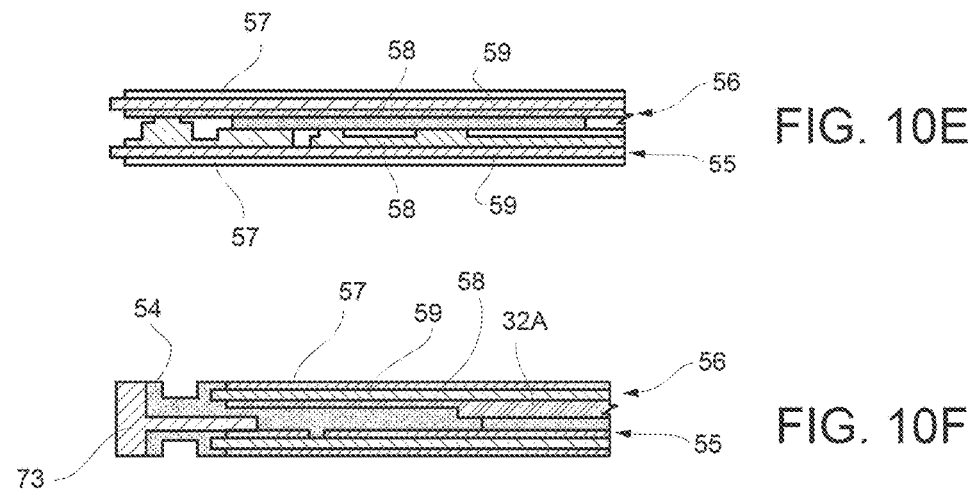
FIG. 10E
FIG. 10F
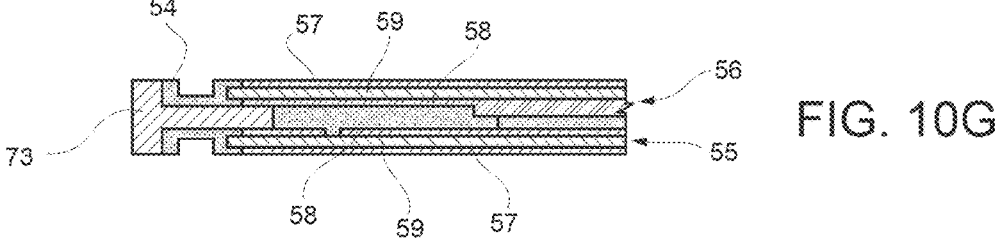
FIG. 10G

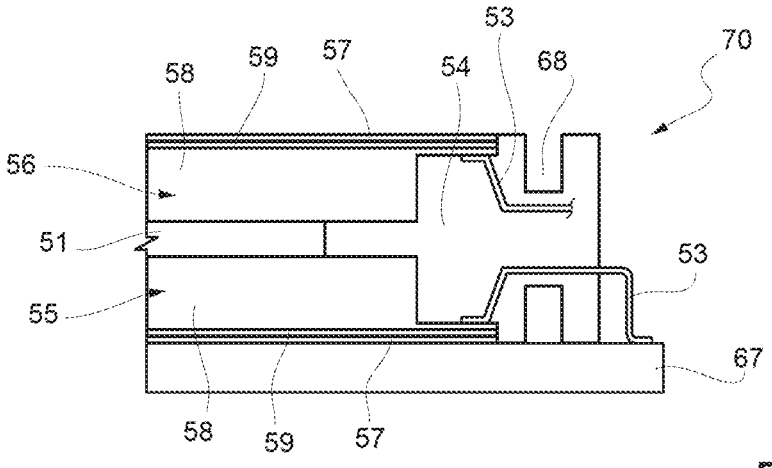
FIG. 15
FIG. 16
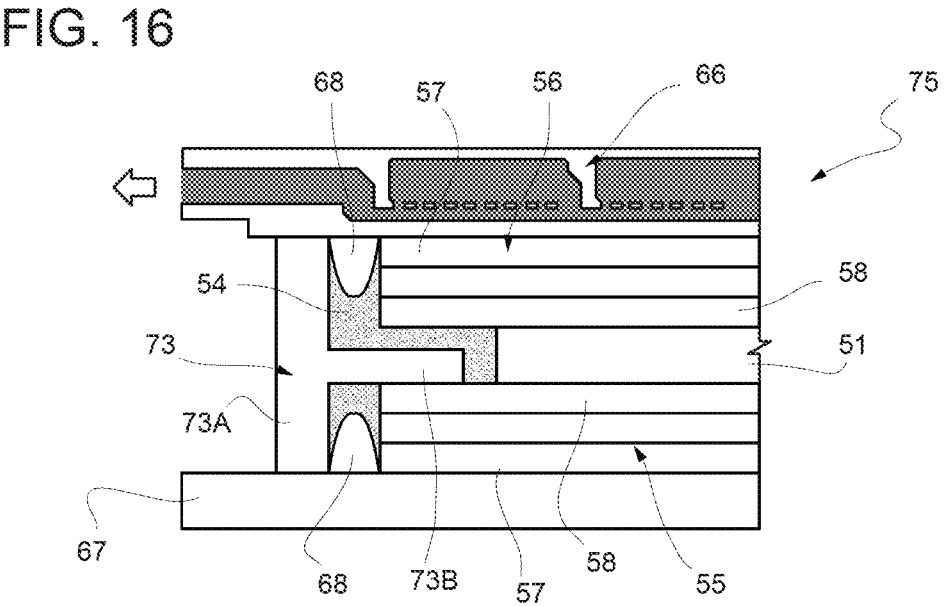

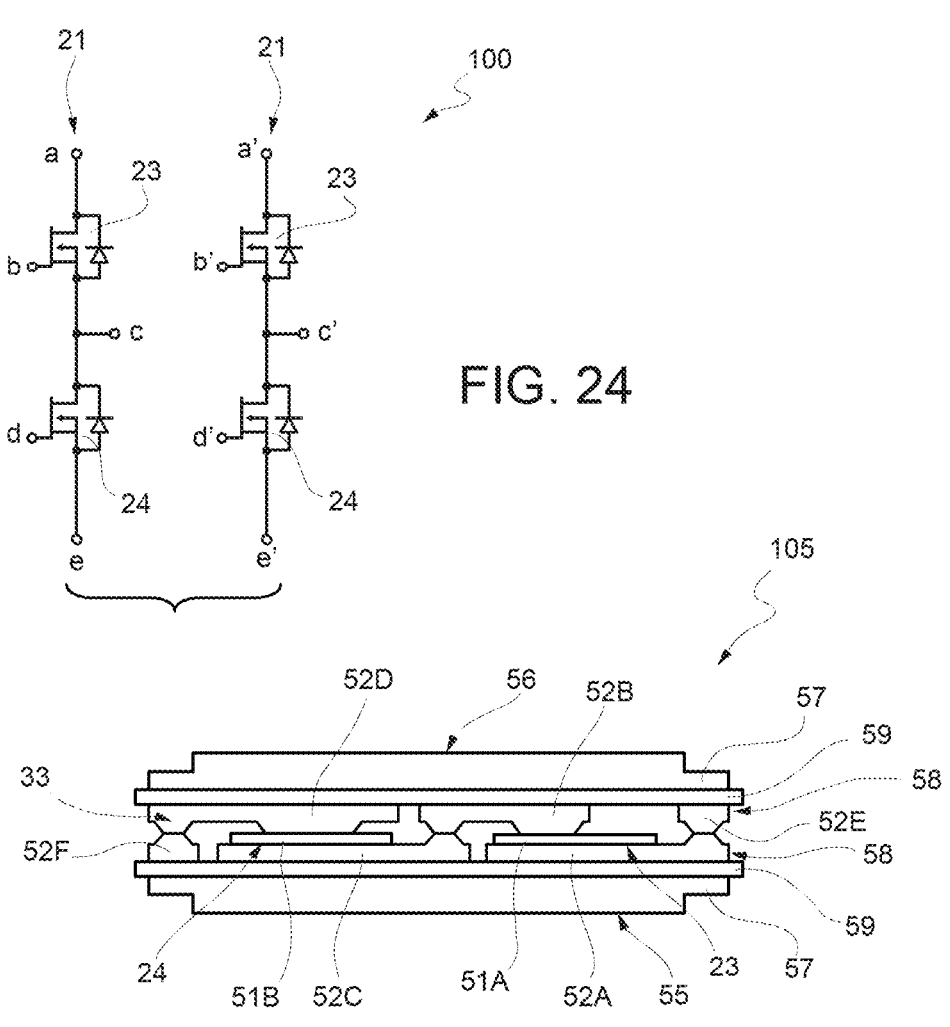
FIG. 24
FIG. 25
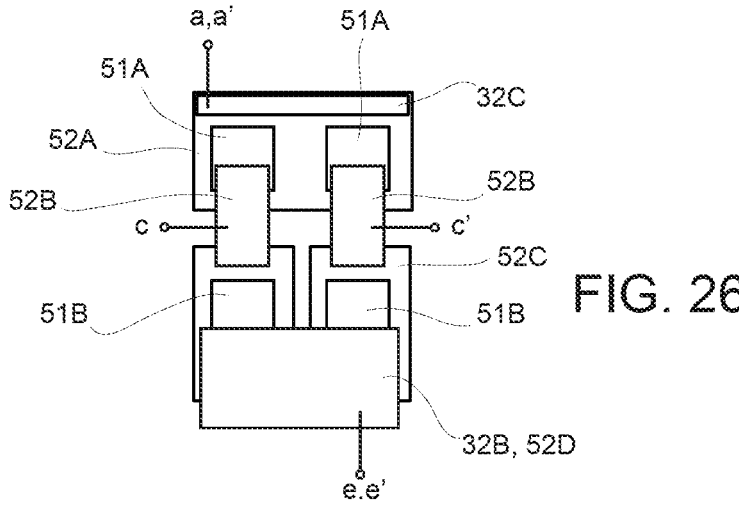
FIG. 26

PACKAGED ELECTRONIC DEVICE COMPRISING A PLURALITY OF POWER TRANSISTORS

BACKGROUND

Technical Field

The present disclosure relates to a packaged electronic device comprising a plurality of power transistors.

Description of the Related Art

For example, the circuit may comprise power devices operating at high voltage (even up to 1200 V) with currents that may rapidly switch, such as silicon carbide or silicon devices, for example super-junction MOSFETs, IGBTs and gallium nitride (GaN) devices and the like.

For such circuits and power electronic devices, particular packages are desired, which allow a high heat dispersion. Such packages are generally formed by insulating rigid bodies, for example of resin, generally of parallelepiped shape, embedding in their interior the electronic component (s), and may comprise a dissipation structure in contact with the electronic component(s), facing the package surface and generally occupying most of a longer base of the parallelepiped shape. The dissipation structure is sometimes formed by the same metal support (called "leadframe") carrying the die or dice integrating one or more electronic components and a plurality of leads for external connection. Generally, in this case, the leadframe has a surface directly facing the outside of the package.

For example, in case of a packaged device comprising a silicon MOSFET transistor, the die integrating the MOSFET transistor may have a drain pad on a first larger surface thereof and at least two contact pads (respectively, source pad and gate pad) on a second larger surface, opposite the first. A transistor contact pad (typically the drain pad) is attached to the leadframe supporting portion, which is in direct contact with one or more leads. The other contact pads (typically, the gate and source pads) are coupled to the other leads through bonding wires or clips. Such a standard package normally has the leads arranged on the same side of the dissipation structure and thus normally allows downward dissipation.

Other devices, for example those comprising GaN, have a different external arrangement of the contacts, but still have a conductive rear surface (forming a source contact), and front contact pads for the other terminals.

BRIEF SUMMARY

The present disclosure is directed to a package allowing upward cooling (TSC—Top Side Cooling), thanks to an appropriate configuration of the lead and leadframe supporting portion. For example, FIG. 1 shows an integrated device 1 comprising two electronic components integrated in respective dice 2A, 2B, and embedded in a packaging insulating mass 3, which has a generally parallelepiped shape, shown in ghost. The integrated device 1 comprises a leadframe 4 formed by a DBC (Direct Bonded Copper) multilayer, comprising a first metal conductive layer, an insulating layer, which is made of ceramic, and a second metal conductive layer.

The second metal conductive layer (visible in FIG. 1) is shaped and forms two conductive portions 5A, 5B, electrically separated, forming respective contact portions for the dice 2A, 2B and directly coupled both to respective drain pads (not visible) of the dice 2A, 2B, and to leads 6. Other leads 7 are connected to the source and gate pads of the dice 2A, 2B, as well as to any other contact pads, through conductive regions 9 forming part of the leadframe 4 and, possibly, wires 8.

The conductive portions 5A, 5B and 9 are thermally coupled to a thermally dissipative region 10 (FIG. 2A), formed by the first metal conductive layer, facing outwards and level (e.g., coplanar) with the upper face of the packaging insulating mass 3. The conductive portions 5A, 5B and 9 are however electrically separated with respect to the thermally dissipative region 10 thanks to the insulating layer.

With this type of package, different circuits and components topologies may be formed, as shown in FIGS. 3A-3I.

The integrated device 1 dissipates on one side and may be attached to a dissipation structure, as shown schematically in FIG. 4. Here the integrated device 1 is attached, at its surface opposite to the thermally dissipative region 10 (FIG. 2A), to a support 15, for example a printed circuit board (PCB) through its leads 6, 7 (not visible in FIG. 4). Furthermore, the thermally dissipative region 10 is attached to a heat sinker 16, for example screwed (17) to the support 15. In use, a cooling fluid (air or liquid 18) is flowed in contact with the heat sinker 16.

This solution, although allowing an effective cooling on one side, is however not optimal in case of electronic devices formed by components having large dimensions, such as MOSFET transistors having high power and high switching currents, and/or having different topologies. In fact, in this case, the packaged device would have large, unsuitable overall dimensions and still would not have suitable dissipation.

To overcome this problem, in Italian patent application 102019000013743 (corresponding to EP 3 780 100), the disclosure is directed to a packaged power electronic device wherein at least two power components are attached to respective electrically insulating and thermally conductive elements, for example DBC (Direct Bonded Copper) substrates and a thermally conductive body (for example a third DBC) is interposed between the power components.

In this manner, the power electronic device may be cooled on both sides and forms a DSC (Double Side Cooling) device which allows a high power dissipation.

This solution is particularly suitable for full bridge circuits, wherein the power components may be spatially arranged so that some metal layers of the DBCs form contact regions between the power components and the external metal layers may be exposed to the action of a cooling fluid.

However, it is not easily applicable to other circuit topologies, for example to inverters and, in any case, has a thickness area that is not always acceptable.

The present disclosure is directed to providing a package solution which overcomes the drawbacks as discussed above.

At least one embodiment of an electronic device of the present disclosure may be summarized as including at least a first and a second branch, each branch including a first and a second transistor arranged in series to each other, the electronic device including a first substrate element, a second substrate element and a plurality of dice of semiconductor material each integrating a respective transistor between the first and the second transistors, the dice being arranged side by side to each other and between the first and the second substrate elements, wherein the first and the second substrate elements each comprise a multilayer including a first conductive layer, a second conductive layer and an insulating layer arranged between the first and the second conductive layers, the first conductive layers of the first and the second substrate elements face towards the outside of the electronic device and define a first and a second main face of the electronic device, and the second conductive layer of the first and the second substrate elements is shaped to form contact regions facing and in selective electrical contact with the plurality of dice.

BRIEF DESCRIPTION OF THE SEVERAL VIEWS OF THE DRAWINGS

For a better understanding of the present disclosure, some embodiments thereof are now described, purely by way of non-limiting example, with reference to the accompanying drawings, wherein:

FIG. 10D is a perspective top view of the electronic device of FIGS. 10A-10C, with the upper portion superimposed to the lower one and in transparency;

FIG. 10E is a side view of the electronic device of FIG. 10D;

FIG. 10F is a side view of a portion of the electronic device of FIGS. 10D and 10E, after packaging;

FIG. 10G is a side view similar to FIG. 10F, according to a variant;

FIG. 15 is a cross-section of part of the present electronic device with a first type of leads;

FIG. 16 is a cross-section of part of the present electronic device with a different type of leads;

FIG. 24 is an electric diagram of a full bridge circuit obtainable with the present electronic device;

FIG. 25 is a cross-section of an electronic device implementing the full bridge circuit of FIG. 24 and using MOSFET transistors according to FIG. 6;

FIG. 26 is a schematic top representation of the mutual arrangement of the components and connection regions for the electronic device of FIG. 25;

Figures 1, 2A, 2B, 3A, 3B, 3C, 3D, 3E, 3F, 3G, 3H, 3I:
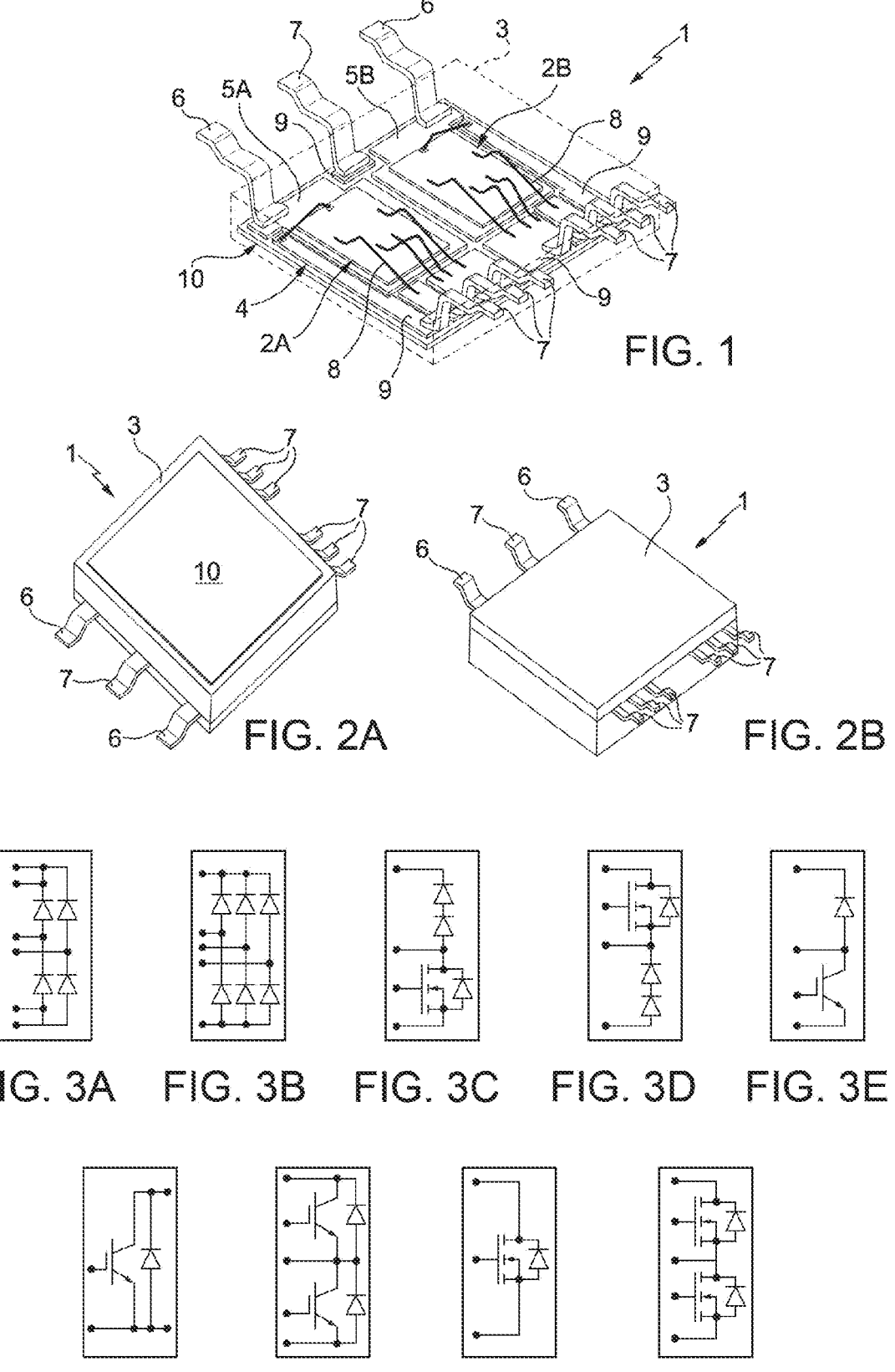
FIG. 1 is a perspective top view, with ghost parts, of a known packaged electronic device.
FIGS. 2A and 2B are perspective top and, respectively, bottom views of the packaged electronic device of FIG. 1.
FIGS. 3A-3I show electric circuit topologies implementable as the packaged electronic device of FIG. 1.

The following description refers to the arrangement shown in the drawings; consequently, expressions such as "above," "below," "upper," "lower," "right," "left" refer to the attached Figures and should not be interpreted in a limiting manner.

DETAILED DESCRIPTION

FIGS. 5-14D regard packaged electronic devices providing phase-inverter power modules (so-called three-phase inverters), advantageously usable in the automotive industry but also, in general, in applications requiring high power transfer.

Figures 4, 5, 6, 7:
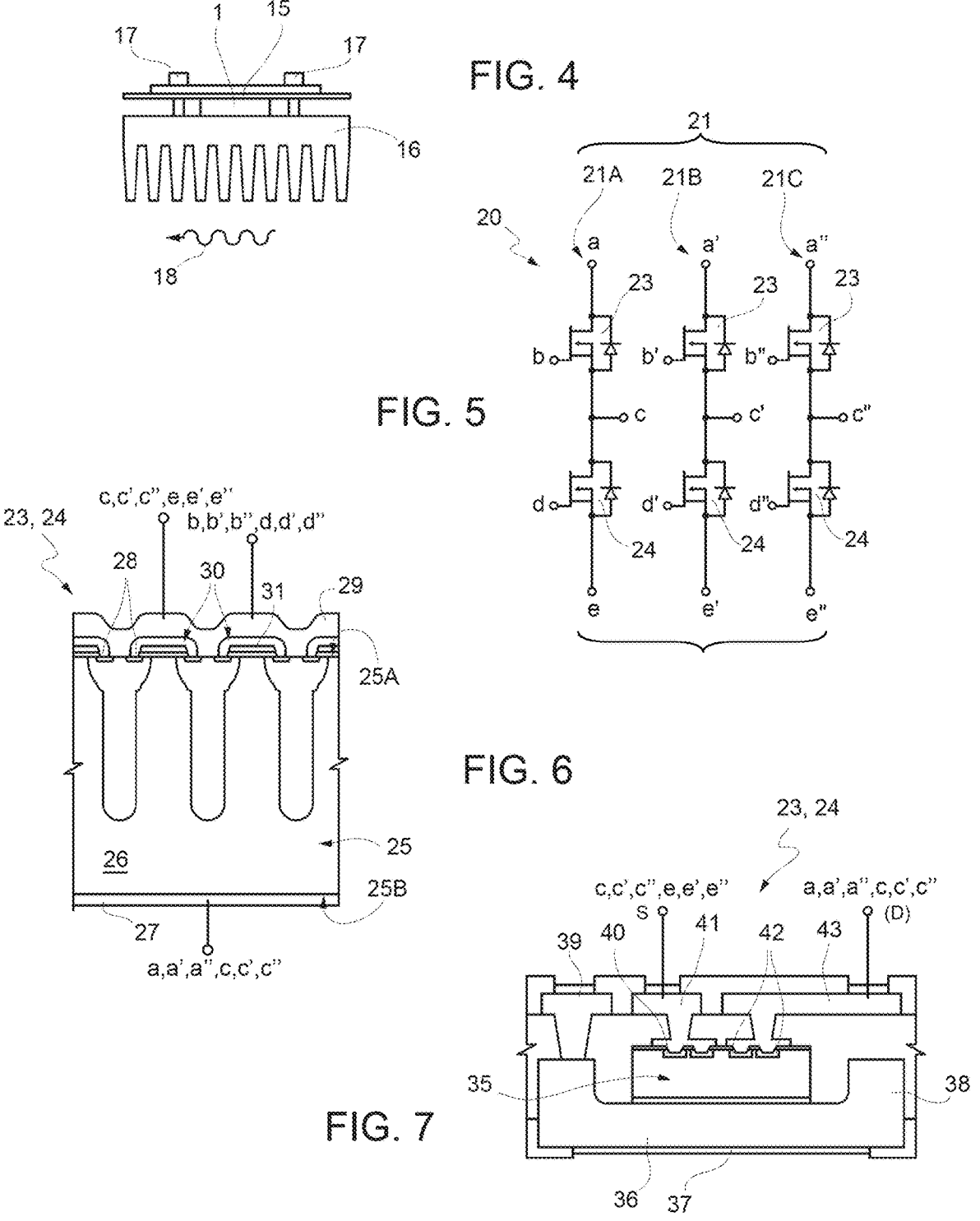
FIG. 4 is a schematic side view of the connection of the packaged electronic device of FIG. 1 to an external heat sinker.
FIG. 5 is an electric diagram of an inverter circuit that may be packaged in a double-cooling package, forming an embodiment of the present electronic device.
FIG. 6 is a simplified cross-section of a MOSFET transistor usable in the inverter circuit of FIG. 5.
FIG. 7 is a simplified cross-section of another MOSFET transistor usable in the inverter circuit of FIG. 5.

FIG. 5 shows the electric diagram of a three-phase inverter 20.

The three-phase inverter 20 is formed by three branches 21, equal to each other, each formed by the series-connection of two power MOSFET transistors (also referred to as upper transistor 23 and lower transistor 24), here N-channel and double-source terminal transistors. When it is necessary to distinguish them, the branches 21 are also identified as first branch 21A, second branch 21B and third branch 21C.

The three-phase inverter 20 has a plurality of terminals, identified by letters a-e, without apex, in the case of the first branch 21A, with a single apex ' in the case of the second branch 21B and with a double apex " in the case of the third branch 21C. As a whole, the three-phase inverter 20 has first terminals a, a', a"; second terminals b, b', b"; third terminals c, c', c"; fourth terminals d, d', d"; and fifth terminals e, e', e".

First terminals a, a', a" are drain terminals of the upper transistors 23 of each branch 21 and are electrically connected to each other (in a manner not shown).

Second terminals b, b', b" are gate terminals of the upper transistors 23 of each branch 21 and are electrically connected to respective output terminals of a driver circuit (not shown).

Third terminals c, c', c" are source terminals of the upper transistors 23 and drain terminals of the lower transistors 24 of each branch 21 and are electrically separated from each other and connected to respective loads (not shown).

Fourth terminals d, d', d" are gate terminals of the lower transistors 24 of each branch 21 and are electrically connected to respective output terminals of the driver circuit (not shown).

Fifth terminals e, e', e" are source terminals of the lower transistors 24 and are electrically connected to each other (in a manner not shown).

In a manner not shown, the upper transistors 23 and the lower transistors 24 may have respective driver source terminals, useful in some applications as a reference for the gate voltage of the upper transistors 23 and connected independently of each other with external metal regions.

The upper and lower transistors 23, 24 may be power MOSFET transistors of any type.

For example, FIG. 6 shows a possible implementation of the upper and lower transistors 23, 24 as charge-balance (also called superjunction) transistors.

In detail, the upper and lower transistors 23, 24 comprise a substrate 25 having an upper surface 25A and a lower surface 25B.

Substrate 25 forms a drain region 26 and is electrically contacted through a drain metal layer 27, extending on the lower surface 25B of the substrate 25 and coupled to the first terminals a, a', a" 15 or to the third terminals c, c', c" of Figure FIGS. 5.

Source regions 28 face the upper surface 25B and are contacted by a source metal layer 29 extending on the upper surface 25A of the substrate 25 and coupled to the third terminals c, c', c" or to the fifth terminals e, e', e" of FIG. 5.

Insulated gate regions 30 extend above the upper surface 25A of the substrate 25 and have respective gate conductive portions 31 coupled to the second terminals b, b', b" or to the fourth terminals d, d', d" of FIG. 5.

Other implementations are possible, for example with vertical-type silicon carbide technology, all characterized by having the drain metal layer 27 arranged on the lower surface 25B of the substrate 25 and the source metal layer 29 arranged on the upper surface 25A of the substrate as shown in FIG. 6.

FIG. 7 instead shows a possible implementation of the upper and lower transistors 23, 24 as planar power MOSFET transistors made using the gallium nitride (GaN) technology.

In FIG. 7, each transistor 23, 24 comprises a die 35 bonded to a conductive base 36; the latter is in contact with a source metallization layer 37 facing a lower side of the transistor 23, 24.

The conductive base 36 forms projections 38 in contact with source contact regions 39 facing an upper side of the device and forming driver source terminals (not shown in FIG. 5).

Source regions 40 formed in the die 35 face the upper surface of the die 35 and are contacted by a source contact structure 41 extending above the die 35 and coupled to the third terminals c, c', c" or to the fifth terminals e, e', e" of FIG. 5.

Drain regions 42 formed in the die 35 face the upper surface of the die 35 and are contacted by a drain contact structure 43 extending above the die 35 and coupled to the first terminals a, a', a" or to the third terminals c, c', c" of FIG. 5.

In a manner per se known to the person skilled in the art, the upper and lower transistors 23, 24 also have gate conductive regions (not shown), coupled to the second terminals b, b', b" or to the fourth terminals d, d', d" of FIG. 5.

FIGS. 8A, 8B, 9A, 9B show an electronic device 50 forming a three-phase inverter and implementing the circuit structure shown in FIG. 5 in case of using transistors 23, 24 of the type shown in FIG. 6 or having a similar configuration of the external contact pads.

Electronic device 50 comprises six dice 51, typically all equal, and implementing the upper and lower transistors 23, 24. For clarity, hereinafter, where useful, the dice 51 are also referred to as first dice 51A, each implementing an upper transistor 23, and second dice 51B, each implementing a lower transistor 24.

Figures 8A, 8B, 9A, 9B:
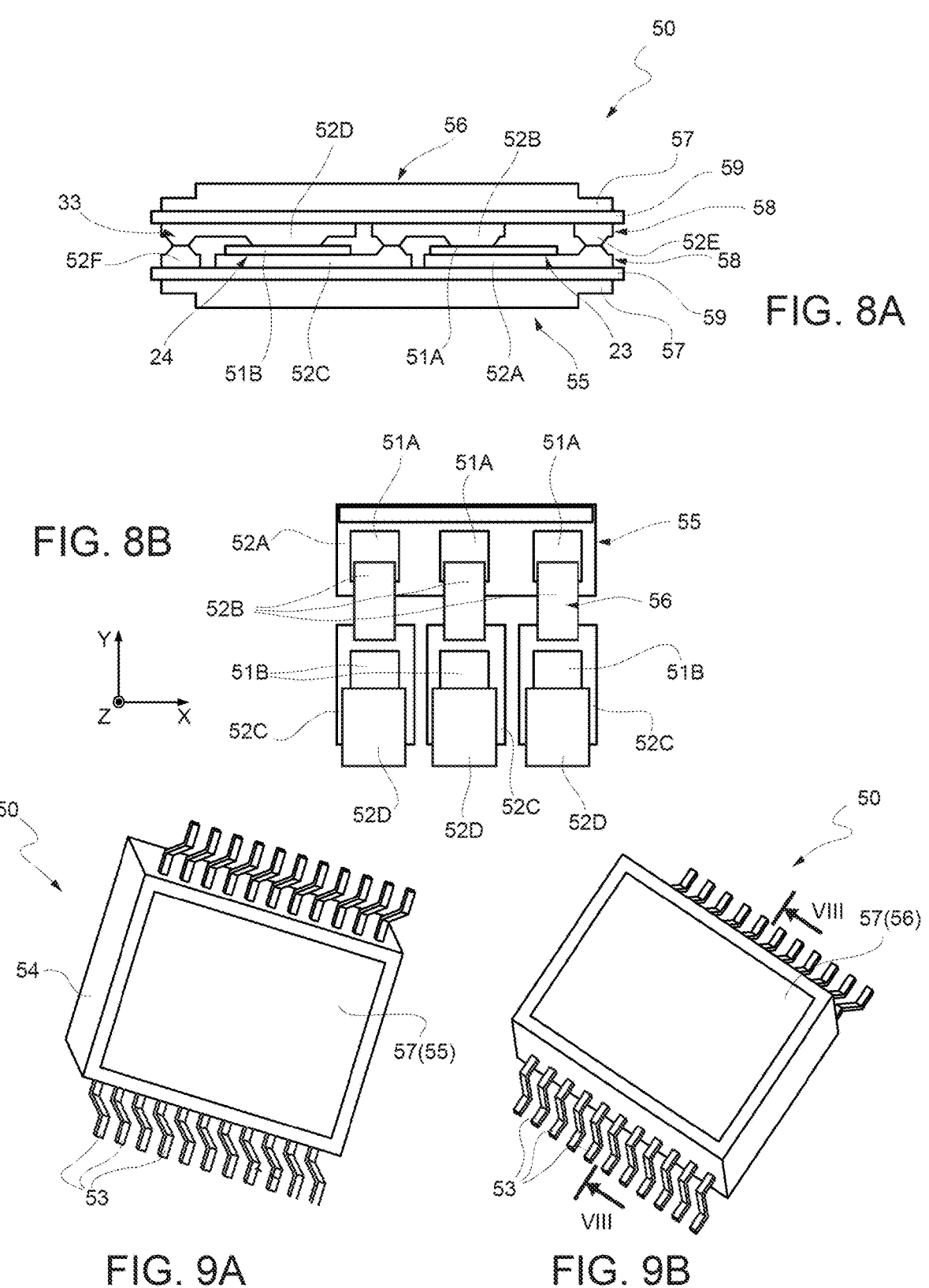
FIG. 8A is a side view of an embodiment of the present electronic device including MOSFET transistors of the type shown in FIG. 6, before packaging.
FIG. 8B is a top schematic representation of the mutual arrangement of the components and connection regions for the electronic device of FIG. 8A.
FIGS. 9A and 9B are respectively a perspective top view and a perspective bottom view of the electronic device of FIG. 8A, after packaging, in case of leads formed as projecting pins.

Dice 51 here face each other and are arranged as visible in FIG. 8A; namely the first dice 51A are aligned with each other, for example parallel to a first axis X of a Cartesian reference system XYZ, and the three second dice 51B are aligned with each other, also parallel to the first axis X and to the group of first dice 51A. Each first die 51A is aligned with a respective second die 51B along a second axis Y of the Cartesian reference system XYZ, so as to simplify the connections, as described below, although such alignments are not indispensable.

Figures 10A, 10B, 10C:
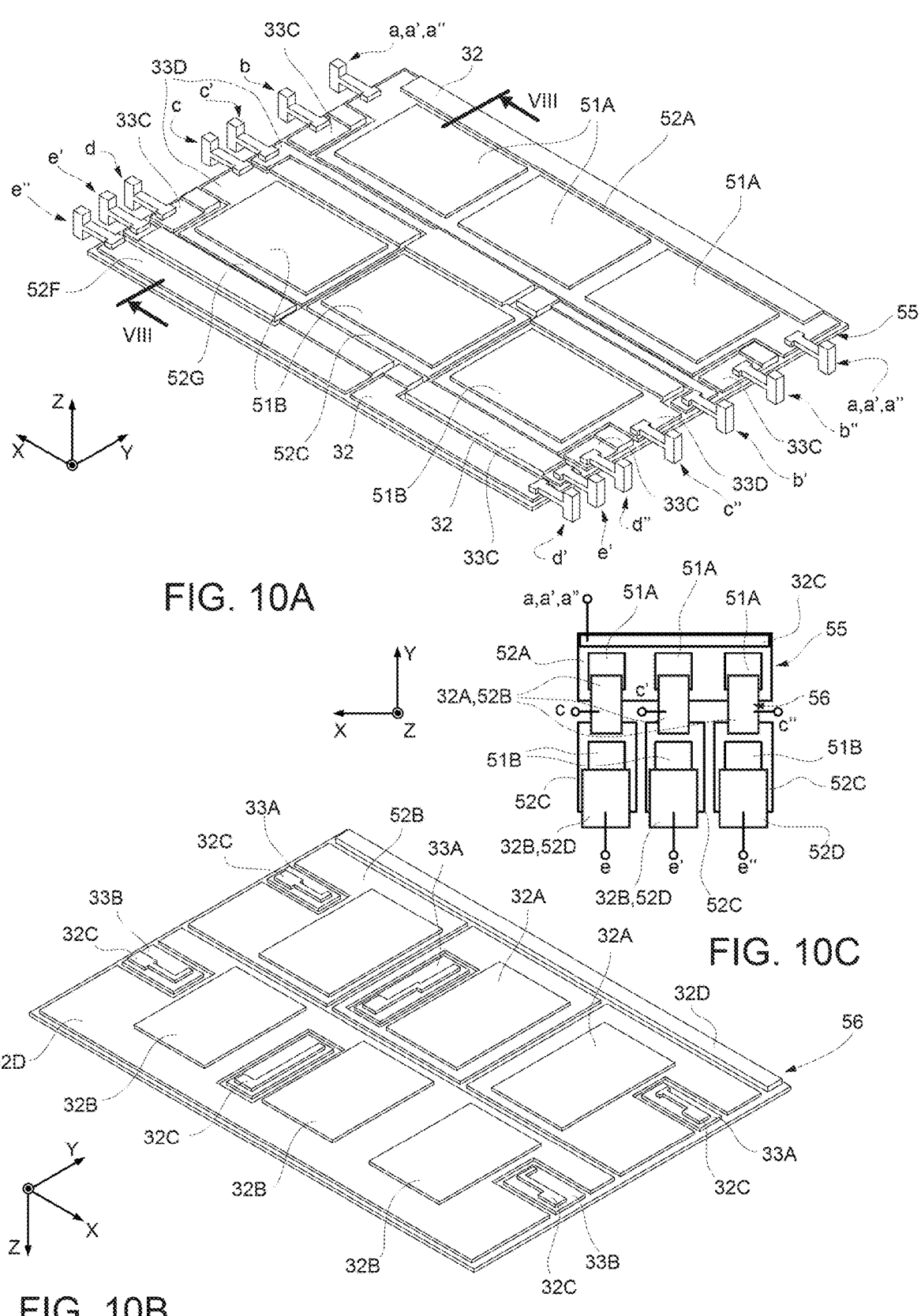
FIG. 10A is a perspective top view of a lower portion of the electronic device of FIG. 8A, in an implementation with lateral leads.
FIG. 10B is a perspective bottom view of an upper portion of the electronic device of FIG. 8A, in the implementation of FIG. 10A.
FIG. 10C is a schematic representation similar to FIG. 8B, shown for illustrative simplicity.
Figure 11:
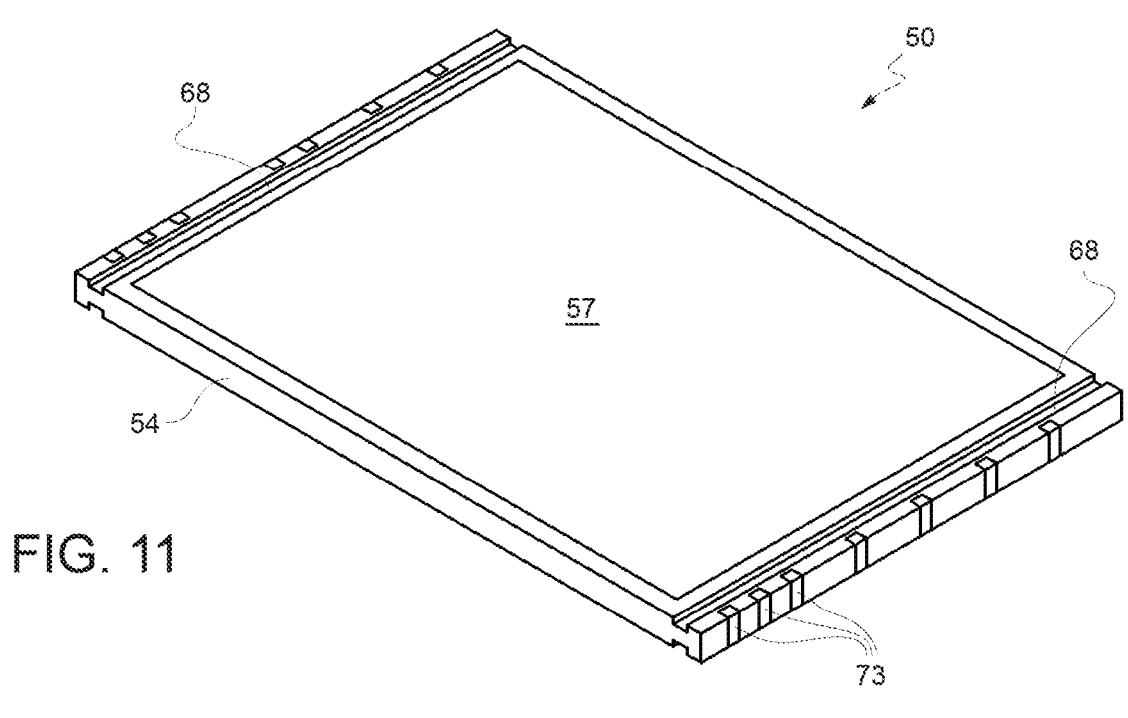
FIG. 11 is a perspective view of the electronic device of FIGS. 10A-10E.

As represented in a simplified manner in the cross-section of FIG. 8A, showing the electronic device 50 before packaging, a first and a second substrate element 55, 56, forming connection and thermal dispersion structures, sandwich the dice 51. In particular, the section of FIG. 8A shows a first die 51A and a second die 51B of the group of six dice 51. However, the same section also apply to the other pairs of dice 51A-51B. The cross-section of FIG. 8A may be taken along line VIII-VIII as shown in FIG. 10A.

Substrate elements 55, 56 are structures having an internal main side (facing the dice 51), which allows an electrical connection of the dice 51, and an external main side, facing the outside of the electronic device 50, electrically insulated from the dice 51, but thermally coupled thereto, to allow the thermal dissipation thereof.

In particular, the substrate elements 55, 56 comprise a first conductive layer 57, arranged externally, typically a metal layer; a second conductive layer 58, arranged internally, typically a metal layer; and an insulating layer 59, intermediate, typically a ceramic layer.

For example, here the substrate elements 55, 56 are formed by DBC (Direct Bonded Copper) and the conductive layers 57, 58 are of copper.

Second conductive layers 58 of the substrate elements 55, 56 (arranged inside the sandwich forming the electronic device 50) are shaped and form respective pluralities of connection regions 52, which electrically couple the terminals of the transistors 23, 24 to each other and outwards.

In detail, with reference to FIG. 8A, showing an upper transistor 23 on the right and a lower transistor 24 on the left of a branch 21 of FIG. 5, the connection regions 52 comprise:

a first drain connection region 52A, formed by the second conductive layer 58 of the first substrate element 55 and coupled to the drain terminals of all the upper transistors 23;

first intermediate connection regions 52B, formed by the second conductive layer 58 of the second substrate element 56 and each coupled to a respective source terminal of the upper transistors 23;

second drain connection regions 52C, formed by the second conductive layer 58 of the first substrate element 55, coupled to the drain terminals of the lower transistors 24 and to the source terminals of the upper transistors 23, in direct electrical connection with the intermediate connection regions 52B and with the third terminals c, c', c";

source connection regions 52D, formed by the second conductive layer 58 of the second substrate element 56 and coupled to the source terminals of the lower transistors 24;

first external coupling regions 52E, formed by the second conductive layer 58 of the second substrate element 56 and in direct electrical connection with the first drain connection regions 52A and with the first terminals a, a', a" (FIG. 5); and second external connection regions 52F, formed by the second conductive layer 58 of the first substrate element 55 and in direct electrical connection with the source connection regions 52D and with the fifth terminals e, e', e" (FIG. 5).

Connection regions 52 may be provided by one or more etchings which remove the material of the second conductive layer 58 of both substrate elements 55, 56 for delimiting the connection regions 52A-52F (when the etching extends through the entire thickness of the second conductive layer 58) and for providing projections 32 (when the etching extends through a part of the thickness of the second conductive layer 58) to allow the electrical contact of the second conductive layers 58 with each other or with the dice 51.

Any height differences of the projections 32 of the two substrate elements 55, 56 in contact with each other with respect to projections 32 in contact with the dice 51 may be compensated by conductive material, such as a solder paste or soldered pillars.

FIGS. 9A and 9B show the electronic device 50 after packaging, in case of leads formed as the projecting pins 53. As is noted (see also FIGS. 10F, 10G and 12), a packaging mass 54, of resin or other moldable, electrically insulating material, surrounds the sandwich shown in FIG. 8A, completely embedding the dice 51 and extending between the second conductive layers 58 and laterally to the insulating layers 59 and the first conductive layers 57, leaving only part of the projecting pins 53 to protrude. The packaging mass 54 thus extends level (e.g., coplanar) with the external faces of the first conductive layers 57, which form the upper and lower surfaces from the electronic device 50.

Since the substrate elements 55, 56 are thermal dissipation structures, and transfer the heat generated by the dice 51 towards the outside, the electronic device 50 is a Double Cooling (DC) device allowing a high and effective thermal dissipation, particularly when coupled to external cooling systems, as discussed hereinbelow.

An embodiment of the electronic device 50 is shown in FIGS. 10A, 10B, 10D-10E, which illustrate in detail a possible shape and arrangement of the connection regions 52 with respect to the dice 51, in case of lateral leads. In these Figures, for simplicity, the various regions are identified by the same reference numbers of FIG. 8A. In particular, the regions 52A-52F are visible in these Figures.

Furthermore, with particular reference to FIGS. 10A, 10B and 10D, the second conductive layers 58 of the substrate element 55, 56 also form:

first gate connection regions 33A (FIG. 10B), formed by the second conductive layer 58 of the second substrate element 56 and coupled to the gate terminals of the upper transistors 23;

second gate connection regions 33B (FIG. 10B), formed by the second conductive layer 58 of the second substrate element 56 and coupled to the gate terminals of the lower transistors 24;

third gate connection regions 33C (FIG. 10A), formed by the second conductive layer 58 of the first substrate element 55, coupled to the gate connection regions 33A, 33B and in direct electrical connection with the second terminals b, b', b" and to the fourth terminals d, d', d" (see also FIG. 5); and load connection regions 33D (FIG. 10A), formed by the second conductive layer 58 of the first substrate element 55, coupled to the first intermediate connection regions 52B and in direct electrical connection with the third terminals c, c', c".

In FIGS. 10A, 10B, 10D-10G are also visible:

first projections 32A (FIGS. 10B, 10C), formed by the second conductive layer 58 of the second substrate element 56 and forming the first intermediate connection regions 52B visible in FIG. 10C;

second projections 32B (FIG. 10B, 10C), formed by the second conductive layer 58 of the second substrate element 56 and forming the second intermediate connection regions 52C visible in FIG. 10C;

third projections 32C (FIG. 10B), formed by the second conductive layer 58 of the second substrate element 56 for the gate connections;

a fourth projection 32D, formed by the second conductive layer 58 of the second substrate element 56 and forming the first external coupling regions 52E.

Similar projections 32 are formed by the second conductive layer 58 of the first substrate element 55 and not described in detail here.

FIGS. 10E and 10F show a side view of the electronic device 50, before packaging, and a ghost view of the left portion thereof (with respect to FIG. 10E), after packaging. FIG. 10G shows a variant of FIG. 10F.

In FIGS. 10E and 10F, the electronic device 50 has bar pins 73, as discussed below. In FIG. 10F, the bar pin 73 is in contact with the sole second conductive layer 58 of the first substrate element 55. In FIG. 10G, the bar pin 73 is in contact with both the second conductive layers 58 of the first and the second substrate elements 55, 56. In this case, in general, this bar pin 73 does not have an electrical function, but a structural support function, as also discussed below, with reference to FIG. 16.

The shape and arrangement of the connection regions 52 with respect to the dice 51 may be seen in FIGS. 10A-10G.

Figure 12:
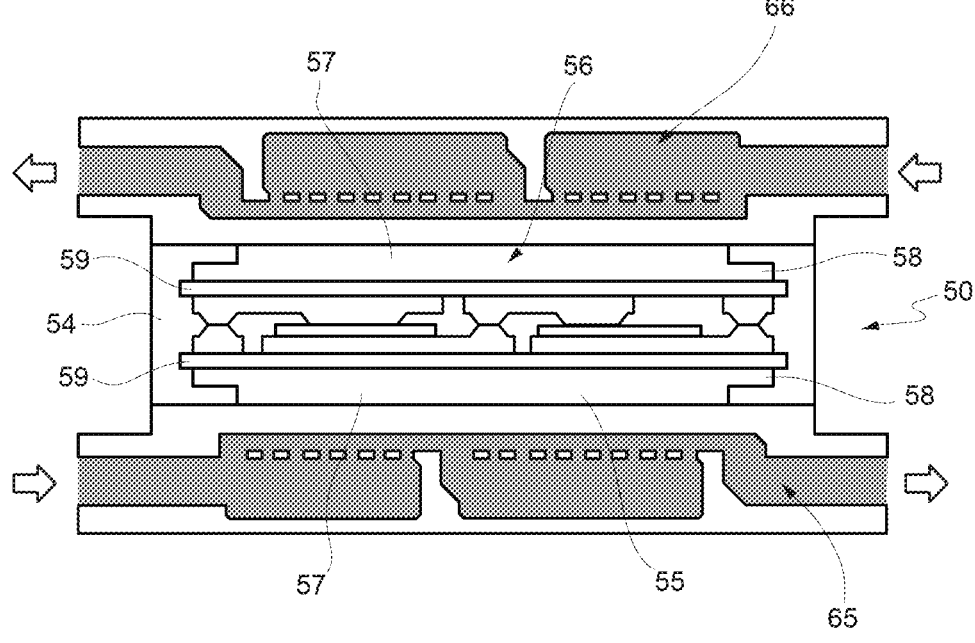
FIG. 12 is a cross-section of the electronic device of FIG. 8A, after packaging and coupling to cooling structures.

As indicated above, the electronic device 50 is a Double Cooling (DC) device and may be coupled to external cooling systems, as shown for example in FIG. 12.

Here, a lower cooling structure 65 is in contact with the first conductive layer 57 of the first substrate element 55 and an upper cooling structure 66 is in contact with the first conductive layer 57 of the second substrate element 56.

In the illustrated example, the cooling structures 65 and 66 use a cooling liquid, however any type of cooling system suitable for the intended application may be used.

Due to the direct contact of the cooling structures 65 and 66 to the substrate elements 55, 56, a very efficient thermal dissipation is obtained.

FIGS. 13, 14A-14D show an electronic device 60 using upper and lower transistors 23, 24 formed as planar power MOSFET transistors based on gallium nitride (GaN), shown in FIG. 7.

In this case, wherein parts equal to the electronic device 50 of FIG. 8A have been indicated with the same reference numbers, the connection islands are shaped differently, to take the different arrangement of the contact pads of the upper and lower transistors 23, 24 of FIG. 5 into account.

Specifically, in FIGS. 13, 14A-14D there are visible:

first source connection regions 62A, formed by the second conductive layer 58 of the first substrate element 55, in electrical contact with respective source metallizations 37 of the upper transistors 23 (FIG. 7) and coupled with third terminals c, c', c" (FIG. 5);

first intermediate connection regions 62B, formed by the second conductive layer 58 of the second substrate element 56 and in electrical contact with the first source connection regions 62A and the source contact regions 39, 40 (FIG. 7) of the upper transistors 23 as well as with the drain contact structures 43 (FIG. 7) of the lower transistors 24;

second source connection regions 62C, formed by the second conductive layer 58 of the first substrate element 55, in electrical contact with respective source metallizations 37 of the lower transistors 24 (FIG. 7) and forming the fifth terminals e, e', e" (FIG. 5);

at least a second intermediate connection region 62D (three in FIG. 14B, only one in FIG. 14C), formed by the second conductive layer 58 of the second substrate element 56 and in electrical contact with second source connection regions 62C and the source contact regions 39, 40 (FIG. 7) of the lower transistors 24;

first external coupling regions 62E, formed by the second conductive layer 58 of the second substrate element 56, in electrical contact with the drain contact structures 43 (FIG. 7) of the upper transistors 23 and coupled with the first terminals a, a', a".

FIGS. 14A-14D also show the regions forming the second terminals b, b', b" and the fourth terminals d, d', d" of FIG. 5.

Electronic devices 50, 60 may be externally coupled through leads of different type.

Figure 17:
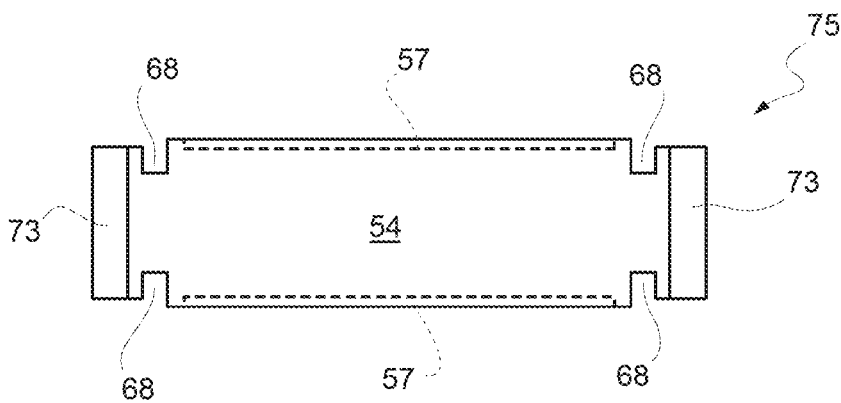
FIG. 17 is a side view of the electronic device of FIG. 16.
Figure 18:
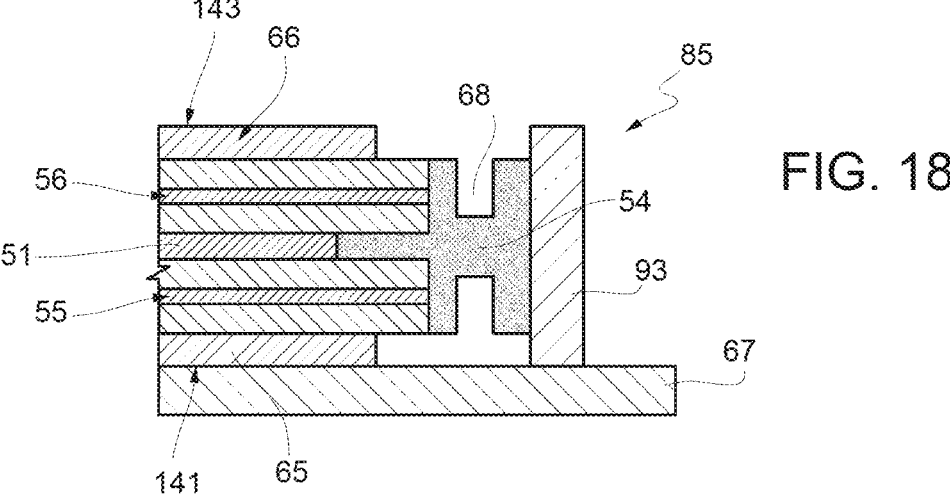
FIG. 18 is a cross-section of part of the present electronic device with another type of leads.

FIG. 15 shows a possible solution for external connection through projecting pins, while FIGS. 16-18 show various solutions suitable for surface mounting, also referred to as leadless solutions, with lateral metal bars (hereinafter also referred to as "bar pins"), possibly having uncovered, solderable lateral sides.

In detail, FIG. 15 shows a possible connection of an electronic device 70 to a bearing structure 67, for example a printed circuit board (PCB), in case of leads formed as projecting pins 53.

Figure 13:
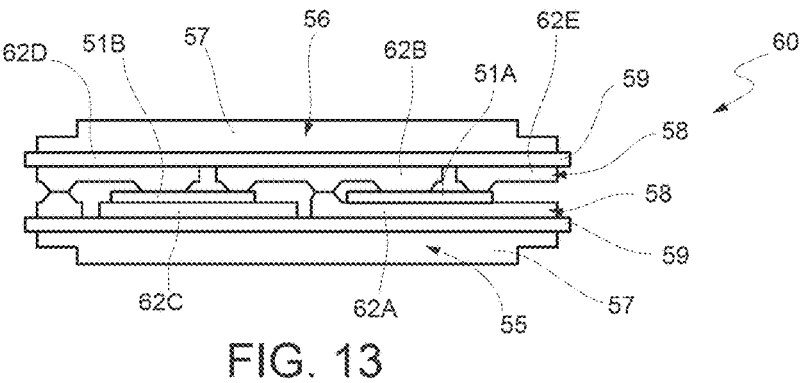
FIG. 13 is a cross-section of the present electronic device in case of the MOSFET transistor of FIG. 7, after packaging.
Figure 14D:
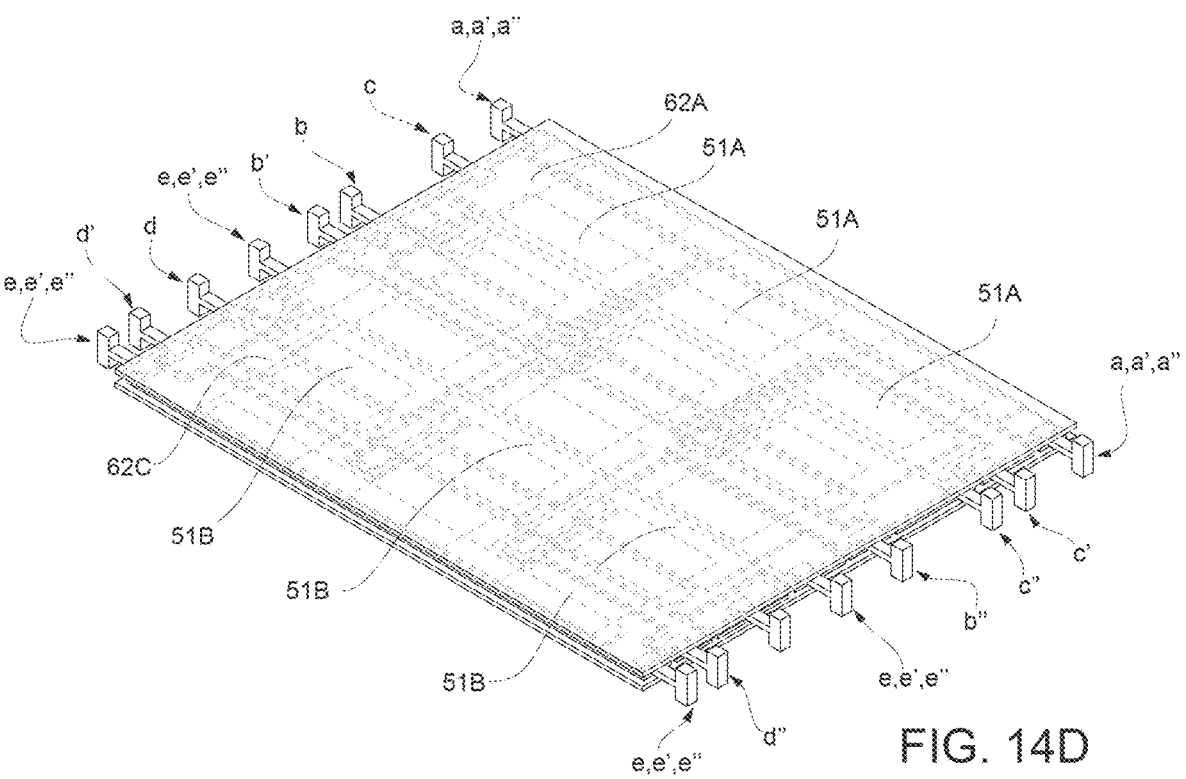
FIG. 14D is a perspective top view of the electronic device of FIGS. 14A-14B, with the upper portion superimposed to the lower one and in transparency.
Figures 14A, 14B, 14C:
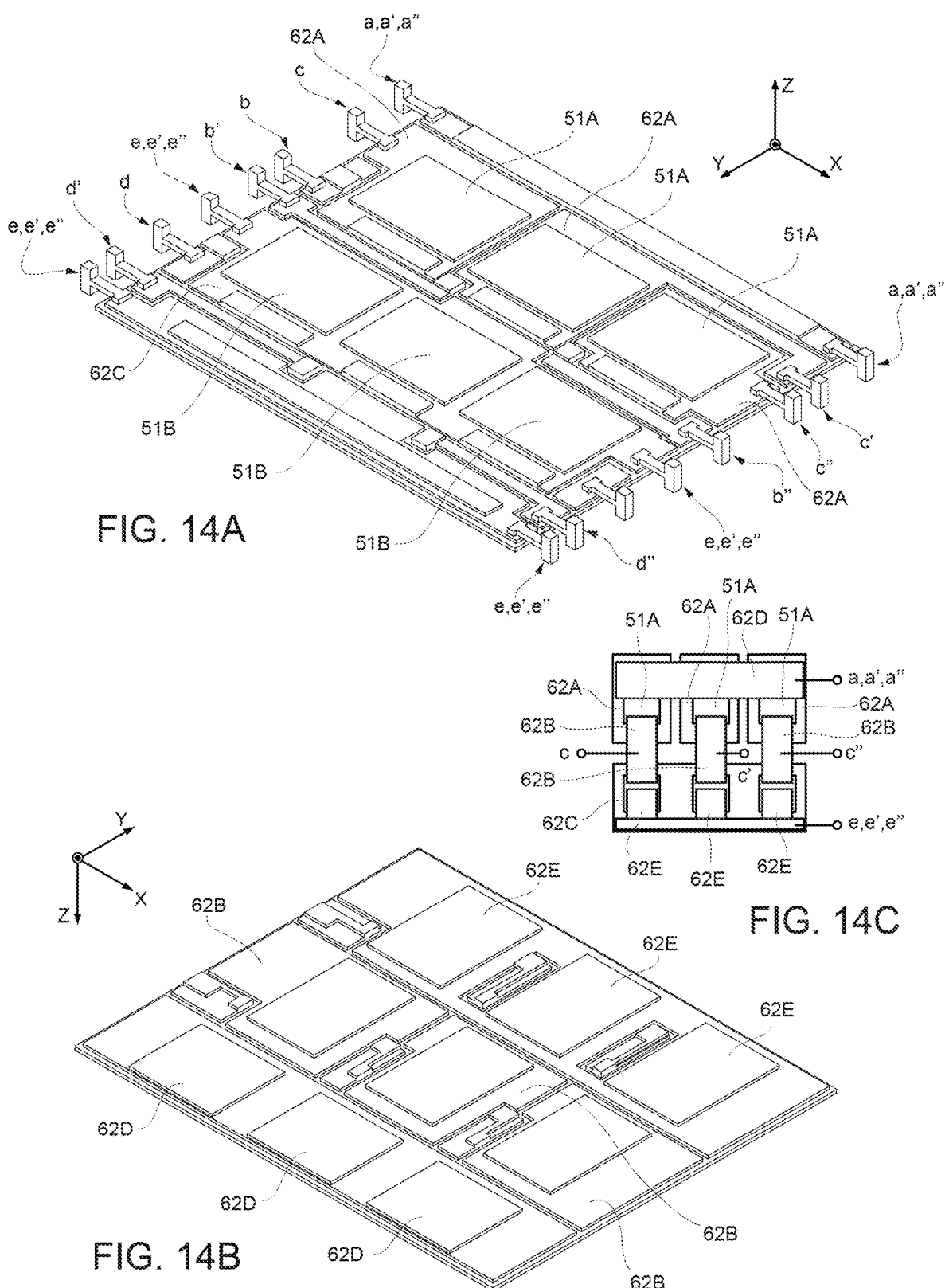
FIGS. 14A and 14B are respectively a perspective top view of a lower portion and a perspective bottom view of an upper portion of the electronic device of FIG. 13, in an implementation with lateral lead.
FIG. 14C is a schematic top representation of the mutual arrangement of the components and connection regions for the electronic device of FIG. 13, with small shape variations.

Electronic device 70 may be formed as described for electronic devices 50, 60 of FIGS. 8A and 13.

Projecting pins 53 are each connected between a respective region between the external connection regions (formed in the second conductive layer 58 of the first substrate element 55 and forming the terminals a, a', a"; b, b', b"; c, c', c"; d, d', d"; e, e', e" of FIG. 5) and a respective conductive region (not shown) formed on the bearing structure 67.

If the electronic device 70 operates at very high voltages/powers (for example, in case of operativeness up to 1200 V) and advanced insulation conditions (high creepage distances) are required, the package 54 may include grooves 68.

In this case, the grooves 68 extend parallel and adjacent to the sides of the package 54 on which the projecting pins 53 extend, typically on two opposite sides of the package 54.

In this manner, the surface distance between the projecting pins 53 and the internal regions increases at different voltage.

Electronic device 70 of FIG. 15 is used for unilateral cooling, since the first substrate element 55 rests on the bearing structure 67, for example a PCB, and any cooling systems (similar to the cooling systems 65, 66 of FIG. 11) may be arranged only over the electronic device 70.

FIG. 16 shows an electronic device 75 having a package 54 of leadless type with bar pins, indicated with 73, having a height equal to the package 54.

The electronic device 75 may be formed as described for the electronic devices 50, 60 of FIGS. 10A-10E, 14A-14D.

Bar pins 73 of the electronic device 75 of FIG. 16 may be connected to the external connection regions 52, 62 in the manner shown in FIG. 16.

In detail, the bar pins 73 of FIG. 16 each comprise a vertical portion 73A, which extends transversely to the substrate elements 55, 56, and a projection 73B, which extends transversely to the vertical portion 73A and parallel to the substrate elements 55, 56.

Projections 73B of the bar pins 73 extend towards the inside of the electronic device 75 and are each soldered to a respective connection region 52 formed in the second conductive layer 58 of the first or the second substrate element 55, 56.

However, more bar pins 73 might be connected to a same connection region 52, based on technological considerations of the designer.

In the cross-section of FIG. 16, the bar pin 73 is connected to one of the connection regions formed in the second conductive layer 58 of the first substrate element 55. Alternatively, it may be connected to one of the connection regions formed in the second conductive layer 58 of the second substrate element 56 or to both, as shown for example in FIG. 10G, for example with a structural support function. In general, the bar pins 73 of the electronic device 75 may be connected to the first substrate element 55 and/or to the second substrate element 56.

Also in this case, if the electronic device 75 is designed to operate at very high voltages/powers and advanced insulation conditions are required, the package 74 may comprise grooves 68, so as to have high creepage distances.

As indicated above and visible in FIG. 17 (see also FIG. 11 for the electronic device 50), the grooves 68 extend parallel and adjacent to the sides of the package 54 whereon the bar pins 73 extend.

Electronic device 75 of FIGS. 16-17 is also used for unilateral cooling, since the first substrate element 55 rests on the bearing structure 67.

FIG. 18 shows an electronic device 85 wherein the bar leads, indicated by 93, project downwardly with respect to the package 54 for a height equal to the height of the lower cooling structure 65.

In particular, in FIG. 18, the bar leads 93 have a greater height with respect to the package 54 and precisely have a height equal to that of the package 54 plus the height of the cooling structures 65, 66.

In other words, as shown in the embodiment in FIG. 18, the bar leads 93 may have a height equal to a height that extends from a surface 141 of a lower cooling structure 65 to a surface 143 of an upper cooling structure 66.

This allows both the lower cooling structure 65 and the upper cooling structure 66 to be arranged as shown in FIG.

18. For example, in some embodiments, the respective surfaces 141, 143 are exposed on opposite sides of the packaging mass 54.

FIGS. 19-23 show high power electronic modules obtainable with the electronic devices 50, 60, 70, 75 and 85 described above.

Figure 19:
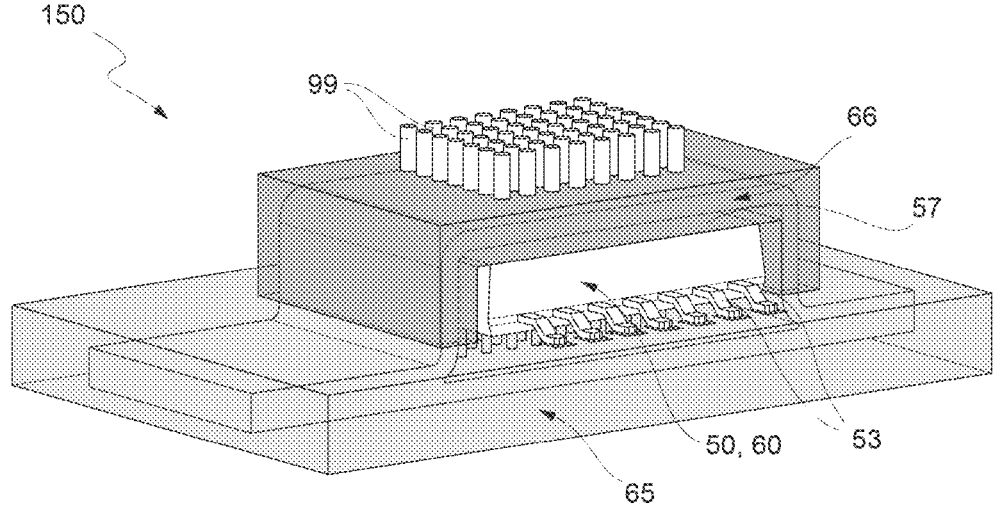
FIGS. 19 and 20 are respectively a perspective view and a side view of an electronic device coupled to cooling structures in case of leads formed as projecting pins.
Figure 20:
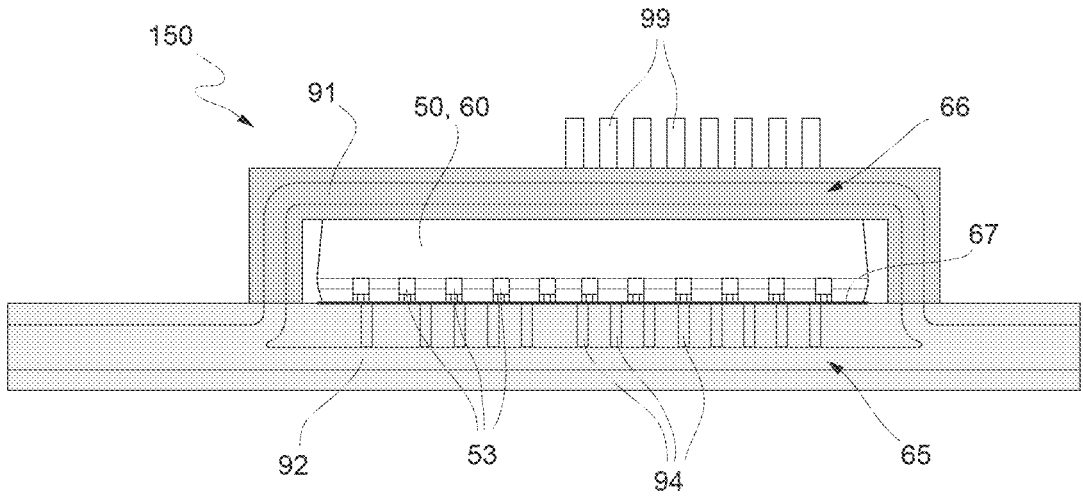

In detail, FIGS. 19 and 20 show a power module 150 obtainable using the electronic device 50, 60, in a configuration with projecting pins 53.

Here, the upper cooling structure 66 is arranged directly in contact with the first conductive layer 57 of the second substrate element 56 (visible only in FIG. 19); conversely, the lower cooling structure 65 is in contact with the bearing structure 67 (represented only in FIG. 20, for clarity).

In the example shown, the upper cooling structure 66 has an upper channel 91 allowing passage of the cooling fluid; the lower cooling structure 65 has in turn a lower channel 92 allowing passage of the cooling fluid.

Channels 91, 92 are also connected to each other upstream and downstream of the electronic device 50, 60, 70.

In the embodiment shown, the upper cooling structure 66 has projections 99 for increasing thermal dissipation and the lower cooling structure 65 has small pillars/columns 94 which extend between the electronic device 50, 60, 70 and the lower channel 92 and favor the heat transfer.

Figures 21, 22, 23:
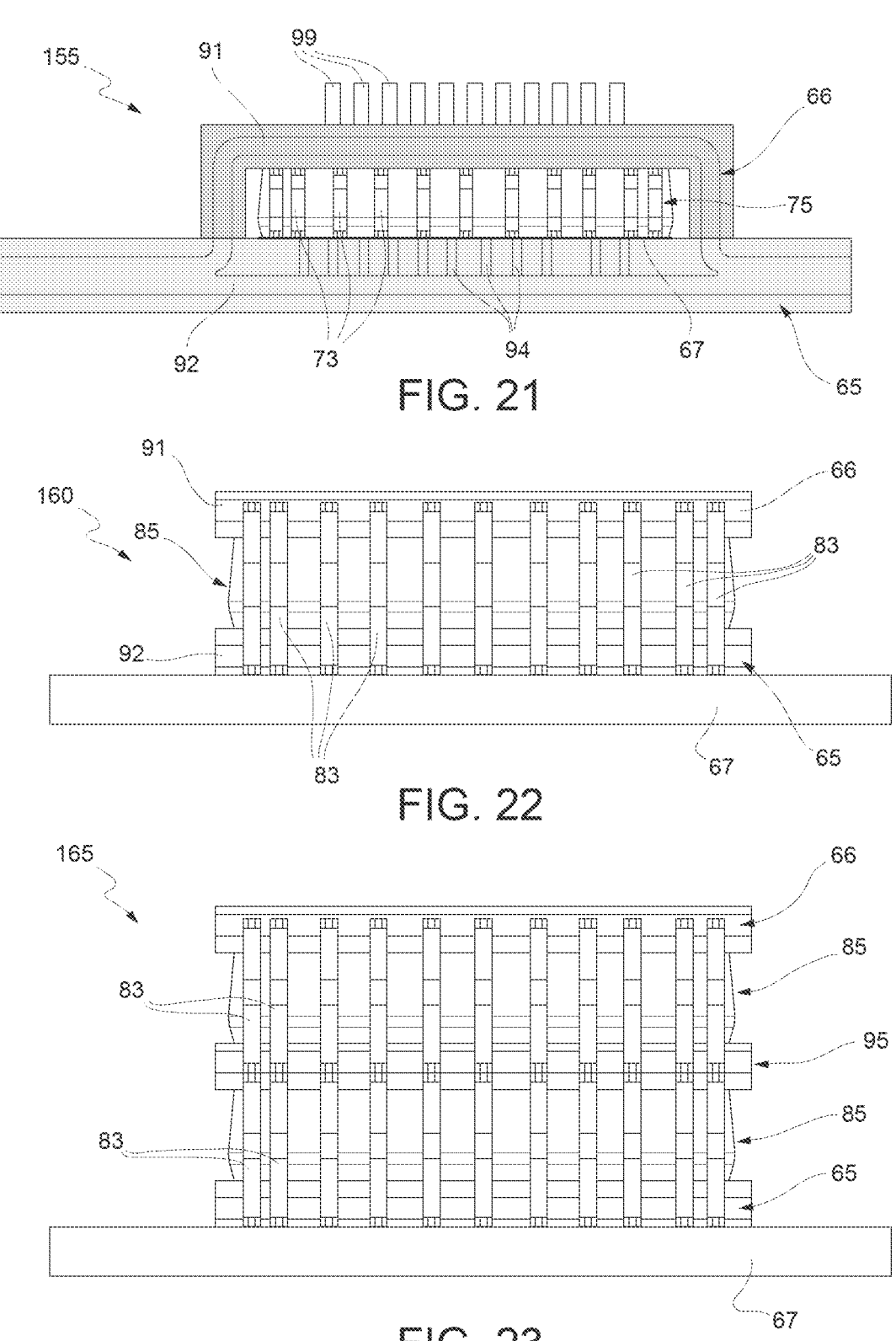
FIGS. 21-23 are side views of different possibilities of coupling a surface-mounting electronic device to cooling structures and to a bearing structure.

FIG. 21 shows a high-power electronic module 155 that may be obtained with the electronic devices 75 having the bar pins 73 with the same height as the respective electronic device 75.

Also here, the upper cooling structure 66 is arranged directly in contact with the upper side of the electronic device 75 (and precisely with the first conductive layer 57 of the second substrate element 56, not visible in FIG. 23) and the lower cooling structure 65 is in contact with the bearing structure 67.

FIG. 22 shows an electronic module 160 having high power obtainable with electronic devices 85 having leads 83 with a greater height with respect to that of the respective electronic device 85.

In this case, therefore, the lower cooling structure 65 may be arranged directly in contact with the lower side of the electronic device 85 (and precisely in contact with the first conductive layer 57 of the first substrate element 55, not visible in FIG. 22).

Bearing structure 67 is therefore arranged here below the lower cooling structure 65.

Bar pins 83 have here a height at least equal to the sum of the heights of the electronic device 85 and of the lower cooling structure 65, so as to be able to be electrically connected to the bearing structure 67.

In this manner, the electronic module 160 has high thermal dissipation and high stability.

FIG. 23 shows an electronic module 165 including a plurality of electronic devices 85 stacked to each other (here two).

In particular, by exploiting the height of the bar pins 83, an intermediate cooling structure (indicated with 95) may be arranged between two superimposed electronic devices 85. By designing the system so that the bar pins 83 have a height equal to that of the respective electronic device 85 and of a cooling system 65, 95, the bar pins 83 may be electrically connected to each other and to the bearing structure 67.

In this manner, the electronic module 165 is highly compact, as well as having the advantages already highlighted for the electronic module 160 of FIG. 22.

FIG. 24 shows the electric diagram of a full bridge circuit 100.

Full bridge circuit 100 may be considered a simplified circuit of the three-phase inverter 20, thus it will be described briefly and using the same reference numbers.

Full bridge circuit 100 is formed by two branches 21 (and precisely 21A, 21B), equal to each other, formed by the series-connection of two power MOSFET transistors (indicated herein again as upper transistor 23 and lower transistor 24).

Full bridge circuit 100 has a plurality of terminals, including respective first terminals a, a'; second terminals b, b'; third terminals c, c'; fourth terminals d, d'; and fifth terminals e, e'.

Also here, each transistor 23, 24 may have driver source terminals, not shown.

Upper transistors 23, lower transistors 24 and terminals a, a', b, b', c, c', d, d', e, e' are equivalent and coupled as described above for the three-phase inverter 20, therefore the description thereof will not be repeated.

In particular, upper transistors 23 and lower transistors 24 may have the structure shown in FIG. 6 or in FIG. 7.

Figure 27:
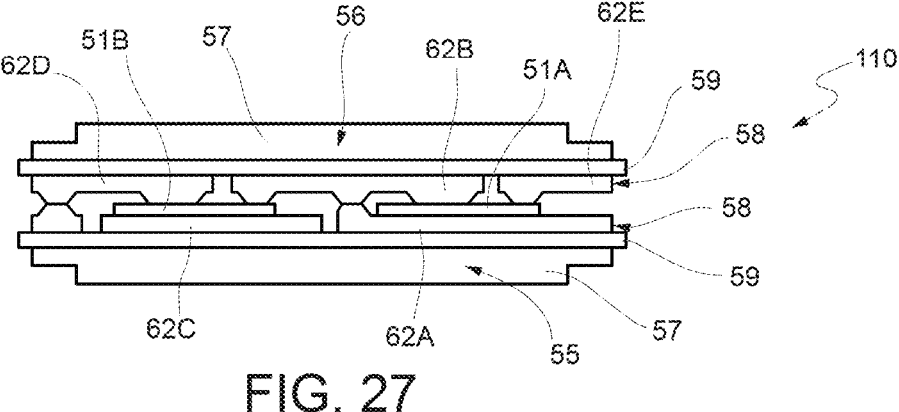
FIG. 27 is a cross-section of an electronic device implementing the full bridge circuit of FIG. 26 and using MOSFET transistors according to FIG. 7.

Consequently, also here, the full bridge circuit 100 may be implemented by an electronic device 105, shown in cross-section in FIG. 25, or by an electronic device 110, shown in cross-section in FIG. 27.

As is noted from the comparison between FIG. 25 and FIG. 8A, the cross-section of the electronic device 105 of FIG. 25 is equal to that of FIG. 8A.

Similarly, the cross-section of the electronic device 110 of FIG. 27 is equal to that of FIG. 13.

Figure 28:
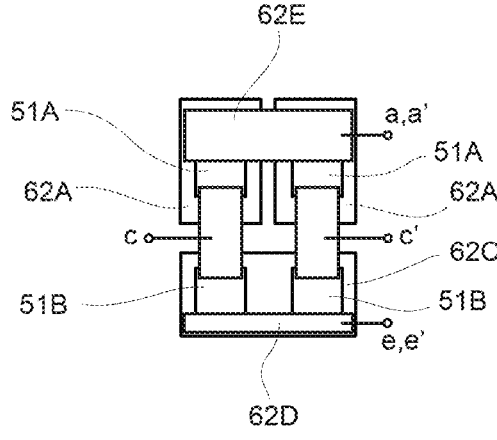
FIG. 28 is a schematic top representation of the mutual arrangement of the components and connection regions for the electronic device of FIG. 27.

Conversely, the simplified connection scheme shown in FIG. 28 has only two portions (corresponding to two branches 21), instead of three portions, as in FIG. 10C.

Electronic devices 105, 110 are therefore also provided as sandwich structures including a first substrate element 55, a second substrate element 56 and the dice 51 (here, four).

Substrate elements 55, 56 are of the type discussed above and in particular the second conductive layer 58 forms the electrical connections between the dice 51 and with the outside, not repeated herein.

Electronic devices 105, 110 may be connected with a substrate (not shown) through leads of any type, including projecting pins and bar pins; the bar pins may have different heights, as described above in FIGS. 15-18 and be coupled to cooling structures 65, 66, 95 as discussed above.

In this manner a board area reduction even up to 50% may be obtained.

The electronic device described herein has numerous advantages.

In particular, in addition to providing a very high thermal dissipation, it has fewer inductive parasitic effects, better thermal performances and greater reliability due to the absence of internal bonding wires.

The electronic device may also be very compact.

The assembly process is simplified and the finished device has high reliability.

The obtainable high creepage distances allow the electronic device to be used in high and very high voltage applications, up to 1200 V.

Finally, it is clear that modifications and variations may be made to the electronic device described and illustrated herein without thereby departing from the scope of the present disclosure, as defined in the attached claims. For example, the different embodiments described may be combined to provide further solutions.

An electronic device (50; 60; 70; 75; 85; 105; 110) may be summarized as including at least a first and a second branch (21A, 21B, 21C), each branch including a first and a second transistor (23, 24) arranged in series to each other, the electronic device including a first substrate element (55), a second substrate element (56) and a plurality of dice (51) of semiconductor material each integrating a respective transistor between the first and the second transistors, the dice being arranged side by side to each other and between the first and the second substrate elements, wherein the first and the second substrate elements (55, 56) each include a multilayer including a first conductive layer (57), a second conductive layer (58) and an insulating layer (59) arranged between the first and the second conductive layers, the first conductive layers (57) of the first and the second substrate elements (55, 56) face towards the outside of the electronic device and define a first and a second main face of the electronic device, and the second conductive layer (58) of the first and the second substrate elements (55, 56) is shaped to form contact regions (52A-52F, 33A-33D; 62A-62D) facing and in selective electrical contact with the plurality of dice (51).

The electronic device may further include a third branch (21C), the third branch including a respective first and a respective second transistor (23, 24) mutually arranged in series, wherein the electronic device forms an inverter circuit (20).

The electronic device may form a full bridge circuit (100).

The first and the second substrate elements (55, 56) may be formed by DBC—Direct Bonded Copper—substrates.

The first and the second transistors (23, 24) may have a first conduction terminal (a, a', c, c'), a second conduction terminal (c, c', e, e') and a control terminal (b, b', d, d'), wherein the second conductive layer (58) of the first substrate element (55) may form a first connection region (52A) coupling the first conduction terminals of the first transistor (23) of the first and the second branches (21A, 21B) and coupled to a first external terminal (a, a') of the electronic device; a second connection region (52C) coupling a first conduction terminal of the second transistor (23) of the first branch (21A) to a second external terminal (c) of the electronic device; and a third connection region (52C) coupling a first conduction terminal of the second transistor (24) of the second branch (21B) to a third external terminal (c') of the electronic device; and the second conductive layer (58) of the second substrate element (56) may form at least a fourth connection region (52D) coupling the second conduction terminals of the second transistor (24) of the first and the second branches (21A, 21B) to a fourth external terminal (e, e') of the electronic device; a fifth connection region (52B) coupling the second connection region (52C) to a second conduction terminal of the first transistor (23) of the first branch (21A); and a sixth connection region (52B) coupling the third connection region (52C) to a second conduction terminal of the first transistor (23) of the second branch (21B), the second conductive layer (58) of the first and/or the second substrate element (55, 56) forming external control regions (b, b', d, d') coupled to the control terminals of the first and the second transistors of the first and the second branches (21A, 21B) of the electronic device.

The first and the second transistors (23, 24) may have a first conduction terminal (a, a', c, c'), a second conduction terminal (c, c', e, e') and a control terminal (b, b', d, d'), wherein the second conductive layer (58) of the first or the second substrate element (55, 56) may form a seventh connection region (61E) coupling the first conduction terminals of the first transistor (23) of the first and the second branches (21A, 21B) and coupled to a fifth external terminal (a, a') of the electronic device; an eighth connection region (62B) coupling a second conduction terminal of the first transistor (23) of the first branch (21A) to a first conduction terminal of the second transistor (23) of the first branch (21A) and to a sixth external terminal (c) of the electronic device; and a ninth connection region (62B) coupling a second conduction terminal of the first transistor (23) of the second branch (21B) to a first conduction terminal of the second transistor (24) of the second branch (21B) and to a seventh external terminal (c') of the electronic device; and at least a tenth connection region (62D) coupling the second conduction terminals of the second transistor (24) of the first and the second branches (21A, 21B) to an eighth external terminal (e, e') of the electronic device; the second conductive layer (58) of the first and/or the second substrate element (55, 56) forming external control regions (b, b', d, d') coupled to the control terminals of the first and the second transistors of the first and the second branches (21A, 21B) of the electronic device.

The electronic device may include a packaging mass (54) laterally surrounding the first substrate element (55), the second substrate element (56) and embedding the plurality of dice (51), the packaging mass (54) being level with the first conductive layers (57) of the first and the second substrate elements (55, 56) at the first and, respectively, the second main faces of the electronic device.

The electronic device may include external connection leads (53; 73; 83) selectively coupled to the contact regions (52A-52F, 33A-33D; 62A-62D) of the second conductive layer (58) of the first and/or second substrate element (55, 56).

The external connection leads may include bar pins (73; 93) for surface mounting having transverse projections (73B) in direct electrical contact with selective contact regions (52A-52F, 33A-33D; 62A-62D).

The first and the second substrate elements (55, 56) and the dice (51) may define a device height and the bar pins (93) have a greater height with respect to the device height.

A power electronic module, may be summarized as including a bearing structure (67); a first electronic device; and a first cooling structure (66), wherein the first electronic device faces the bearing structure (67) with the first main face and is in contact with the cooling structure with the second main face.

The first electronic device may have bar pins (93) of greater height with respect to the device height, and may further include a second cooling structure (65) arranged between the second face of the first electronic device and the bearing structure (67).

The bar pins (93) may have a height at least equal to the sum of the heights of the first electronic device (85) and of the second cooling structure (65) and are in direct electrical contact with the bearing structure (67).

The bar pins (93) may have a height equal to the sum of the heights of the first electronic device (85), the first cooling structure (66) and the second cooling structure (65) and may be in direct electrical contact with the bearing structure (67).

The power electronic module may further including a second electronic device (85) arranged above the first electronic device (85) and below the first cooling structure (66) and a third cooling structure (95) arranged between the first and the second electronic devices (85).

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
a bearing structure;
a first electronic device including
a first main face and a second main face opposite to the first main face;
a first height that extends from the first main face to the second main face in a direction directed from the first main face to the second main face;
a plurality of bar pins, each respective bar pin of the plurality of bar pins has a bar pin height that extends in the direction, the plurality of bar pins are in direct electrical contact with the bearing structure;
a first branch including a first transistor and a second transistor arranged in series;
a second branch including a third transistor and a fourth transistor arranged in series;
a first substrate element;
a second substrate element spaced apart from the first substrate element; and
a plurality of dice arranged side by side to each other and between the first and the second substrate elements, the plurality of dice including:
a first die including the first transistor of the first branch;
a second die including the second transistor of the first branch;
a third die including the third transistor of the second branch; and
a fourth die including the fourth transistor of the second branch, and
wherein the first and the second substrate elements each comprise a multilayer including a first conductive layer, a second conductive layer, and an insulating layer arranged between the first and the second conductive layers,
the first conductive layers of the first and the second substrate elements, respectively, face towards an outside of the first electronic device and define the first main face and the second main face, respectively, and
the second conductive layers of the first and the second substrate elements include contact regions facing towards the plurality of dice and in selective electrical contact with the plurality of dice;
a first cooling structure coupled to the first main face of the first electronic device, the first cooling structure including a second height that extends in the direction; and
a second cooling structure coupled to the second main face of the first electronic device, the second cooling structure including a third height that extends in the direction, wherein the bar pin height is equal to a sum of the first height of the first electronic device, the second height of the first cooling structure, and the third height of the second cooling structure.

2. The electronic device according to claim 1, further comprising a third branch, the third branch including a fifth transistor and a sixth transistor arranged in series.

3. The electronic device according to claim 1, wherein the first branch and the second branch are a full bridge circuit.

4. The electronic device according to claim 1, wherein the first and the second substrate elements are formed by-Direct Bonded Copper (DBC) substrates.

5. The electronic device according to claim 1, further comprising:
a first external terminal;
a second external terminal;
a third external terminal; and
a fourth external terminal, and wherein:
the first transistor, the second transistor, the third transistor, and the fourth transistor each have a first conduction terminal, a second conduction terminal, and a control terminal,
the second conductive layer of the first substrate element includes:
a first connection region coupling the first conduction terminal of the first transistor of the first branch to the first conduction terminal of the third transistor of the second branch, and the first connection region is coupled to the first external terminal;
a second connection region coupling the first conduction terminal of the first transistor of the first branch to the second external terminal; and
a third connection region coupling the first conduction terminal of the second transistor of the second branch to a third external terminal;
the second conductive layer of the second substrate element includes:
a fourth connection region coupling the second conduction terminal of the second transistor of the first branch to the second conduction terminal of the fourth transistor of the second branch, and the second connection region is coupled to a fourth external terminal;
a fifth connection region coupling the fourth connection region to the second conduction terminal of the first transistor of the first branch; and
a sixth connection region coupling the third connection region to the first conduction terminal of the third transistor of the second branch,
at least one of the following of the second conductive layers of the first and the second substrate elements including external control regions coupled to the control terminals of the first transistor, the second transistor, the third transistor, and the fourth transistor of the first and the second branches, respectively.

6. The electronic device according to claim 1, further comprising:
a first external terminal;
a second external terminal; and
a third external terminal, and wherein:
the first transistor, the second transistor, the third transistor, and the fourth transistor have a first conduction terminal, a second conduction terminal, and a control terminal, wherein the second conductive layer of at least one of the following of the first substrate element and the second substrate element includes:

a first connection region coupling the first conduction terminal of the first transistor of the first branch to the first conduction terminal of the third transistor of the second branch, and the first connection region is coupled to a first external terminal;

a second connection region coupling the second conduction terminal of the first transistor of the first branch to the first conduction terminal of the second transistor of the first branch, and the second connection region is coupled to a second external terminal;

a third connection region coupling the second conduction terminal of the first transistor of the second branch to the first conduction terminal of the fourth transistor of the second branch, and the third connection region is coupled to a third external terminal of the electronic device; and a fourth connection region coupling the second conduction terminals of the second transistor of the first branch and the fourth transistor of the second branch to a fourth external terminal of the electronic device;

wherein the second conductive layer of at least one of the following of the first substrate element and the second substrate element including external control regions coupled to the control terminals of the first transistor, the second transistor, the third transistor, and the fourth transistor of the first and the second branches, respectively.

7. The electronic device according to claim 1, further comprising a packaging mass laterally surrounding the first substrate element, the second substrate element and embedding the plurality of dice, the packaging mass being coplanar with the first conductive layers of the first and the second substrate elements at the first main face and the second main face, respectively.

8. The electronic device according to claim 1, comprising external connection leads selectively coupled to the contact regions of the second conductive layer of at least one of the following of the first substrate element and the second substrate element.

9. The electronic device according to claim 8, wherein the external connection leads include bar pins for surface mounting having transverse projections in direct electrical contact with selective contact regions.

10. The electronic device according to claim 9, wherein a device height extends in a direction directed from the first main face to the second main face and extends from the first main face to the second main face, and the bar pins have a bar pin height that extends in the direction directed from the first main face to the second main face and is greater than the device height.

11. The device of claim 1, further comprising a packaging mass on the bar pin.

12. The device of claim 11, wherein the packaging mass includes a groove that overlaps the bar pin.

13. The device of claim 1, wherein the plurality of bar pins are in electrical communication with at least one of the second conductive layers of the first and second substrate elements.

14. A power electronic module, comprising:
a bearing structure;
a first electronic device including:
a first main face and a second main face opposite to the first main face, the first main face is on the first cooling structure;

a first height that extends from the first main face to the second main face in a direction directed from the first main face to the second main face;
bar pins having a bar pin height that extend in the direction directed from the first main face to the second main face;
a first branch including a first transistor and a second transistor arranged in series;
a second branch including a third transistor and a fourth transistor arranged in series;
a first substrate element;
a second substrate element spaced apart from the first substrate element; and
a plurality of dice arranged side by side to each other and between the first and the second substrate elements, the plurality of dice including:
a first die including the first transistor of the first branch;
a second die including the second transistor of the first branch;
a third die including the third transistor of the second branch; and
a fourth die including the fourth transistor of the second branch;
a first cooling structure on the first main face of the first electronic device, the first cooling structure having a second height that extends in the direction directed from the first main face to the second main face; and
a second cooling structure on the second main face of the first electronic device, the second cooling structure having a third height that extends in the direction directed from the first main face to the second main face;
wherein the bar pin height of the bar pins is equal to a sum of the first height of the first electronic device, the second height the first cooling structure, and the third height of the second cooling structure, and the bar pins are in direct electrical contact with the bearing structure;
wherein the first and the second substrate elements each comprise a multilayer including a first conductive layer, a second conductive layer and an insulating layer arranged between the first and the second conductive layers,
wherein the first conductive layers of the first and the second substrate elements, respectively, face towards an outside of the electronic device and define the first main face and the second main face, respectively, and
wherein the second conductive layers of the first and the second substrate elements include contact regions facing towards the plurality of dice and in selective electrical contact with the plurality of dice.

15. The power electronic module according to claim 14, further comprising:
a second electronic device arranged above the first electronic device and below the first cooling structure; and
a third cooling structure arranged between the first and the second electronic devices.

16. A device, comprising:
a bearing structure;
a first electronic device including:
a first main face and a second main face opposite to the first main face;
a first height that extends in a direction from the first main face to the second main face;
a first substrate including:
a first sidewall;

a first surface and a second surface opposite to the first surface, the first surface is at the first main face;

a first conductive layer at the first surface;

a first insulating layer on the first conductive layer; and a second conductive layer on the first insulating layer and at the second surface;

a second substrate including:

a second sidewall;

a third surface and a fourth surface opposite to the third surface, the third surface faces towards the first substrate and the fourth surface is at the second main face;

a third conductive layer at the third surface;

a second insulating layer on the second conductive layer; and a fourth conductive layer on the insulating layer and at the fourth surface;

a first cooling structure coupled to the first conductive layer of the first substrate and on the first main face, the first cooling structure having a second height that extends in the direction;

a second cooling structure opposite to the first cooling structure, the second cooling structure coupled to the fourth conductive layer of the second substrate and on the second main face, the second cooling structure having a third height that extends in the direction;

at least one bar pin having a bar pin height that extends in the direction, the at least one bar pin is coupled to the first substrate, the bar pin height of the at least one bar pin is equal to a sum of the first height, the second height, and the third height, the at least one bar pin is in direct electrical contact with the bearing structure;

a plurality of dice on the first conductive layer and overlapped by the second conductive layer, the plurality of die being coupled to the first conductive layer and the second conductive layer; and a packaging mass that is between the second surface of the first substrate and the third surface of the second substrate, the packaging mass including:

a portion that extends outward from the first and second sidewalls; and a groove that extends into the portion.

17. The device of claim 16, wherein the plurality of dice includes:

a first branch of dice including:

a first die with a first transistor; and a second die with a second transistor, the second transistor being in series with first transistor;

a second branch of dice including:

a third die with a third transistor; and a fourth die with a fourth transistor, the fourth transistor being in series with the third transistor;

a third branch of dice including:

a fifth die with a fifth transistor; and a sixth die with a sixth transistor, the sixth transistor being in series with the fifth transistor.

18. The device of claim 17, wherein first conduction terminals of the first transistor, the second transistor, and the third transistor are coupled to each other through a first connection region of the third conductive layer of the second substrate, and second conduction terminals of the second transistor, the fourth transistor, and the sixth transistor are coupled to each other through a second connection region of the third conductive layer of the second substrate.

19. The device of claim 17, wherein the first conduction terminals of the first transistor, the second transistor, and the third transistor are coupled to each other through a connection region of the second conductive layer of the first substrate.

20. The device of claim 16, wherein the packaging mass extends around the first substrate and the second substrate covers the first sidewall of the first substrate and the second sidewall of the second substrate, and the portion of the packaging mass:

includes a fifth height that extends in the direction directed from the first surface to the second surface that is equal to the bar pin height.

* * * * *